US012361984B2

(12) United States Patent
Lu et al.

(10) Patent No.: US 12,361,984 B2
(45) Date of Patent: Jul. 15, 2025

(54) NOISE REDUCTION IN SENSE AMPLIFIERS FOR NON-VOLATILE MEMORY

(71) Applicant: SanDisk Technologies LLC, Addison, TX (US)

(72) Inventors: Iris Lu, Fremont, CA (US); Yonggang Wu, San Jose, CA (US); Kou Tei, San Jose, CA (US); Ohwon Kwon, Pleasanton, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 191 days.

(21) Appl. No.: 18/346,359

(22) Filed: Jul. 3, 2023

(65) Prior Publication Data

US 2024/0331741 A1 Oct. 3, 2024

Related U.S. Application Data

(60) Provisional application No. 63/493,265, filed on Mar. 30, 2023.

(51) Int. Cl.
*G11C 7/10* (2006.01)
*G11C 7/12* (2006.01)

(52) U.S. Cl.
CPC .......... *G11C 7/1048* (2013.01); *G11C 7/1039* (2013.01); *G11C 7/12* (2013.01)

(58) Field of Classification Search
CPC ........ G11C 7/1048; G11C 7/1039; G11C 7/12
See application file for complete search history.

(56) References Cited

U.S. PATENT DOCUMENTS

| | | | |
|---|---|---|---|
| 10,210,924 B2* | 2/2019 | Kamata | G11C 11/4094 |
| 10,304,550 B1 | 5/2019 | Nguyen et al. | |
| 10,643,695 B1 | 5/2020 | Nguyen et al. | |
| 10,811,082 B1 | 10/2020 | Li et al. | |
| 10,825,526 B1 | 11/2020 | Li et al. | |
| 11,024,392 B1 | 6/2021 | Chen et al. | |
| 11,043,276 B1 | 6/2021 | Yadala et al. | |
| 11,087,800 B1 | 8/2021 | Yabe | |
| 11,139,022 B1 | 10/2021 | Tei et al. | |
| 11,264,106 B2* | 3/2022 | Maejima | G11C 16/32 |
| 11,501,825 B2* | 11/2022 | Sako | G11C 11/4096 |
| 11,532,370 B1 | 12/2022 | Yang et al. | |
| 2022/0415415 A1 | 12/2022 | Tseng et al. | |

* cited by examiner

*Primary Examiner* — Vanthu T Nguyen
(74) *Attorney, Agent, or Firm* — Pearl Cohen Zedek Latzer Baratz LLP

(57) ABSTRACT

Techniques are presented to reduce sense amplifier noise from parasitic capacitances that can affect the internal transfer of a data value from a data latch to a sensing node. To transfer the data value, the sensing node is pre-charged and the data value used to set the control gate voltage on a transistor in a discharge path for the sensing node. In the discharge path, the transistor is connected in series with a switch, so that when the switch is turned on, the data value on the transistor's control gate will determine whether or not the sensing node discharges. To reduce noise in the process, before the data value is used to bias the discharge path transistor's control gate, a node between the transistor and switch is charged. Additionally, a lower voltage level can be used to turn on the discharge path switch.

20 Claims, 22 Drawing Sheets

Figure 7A
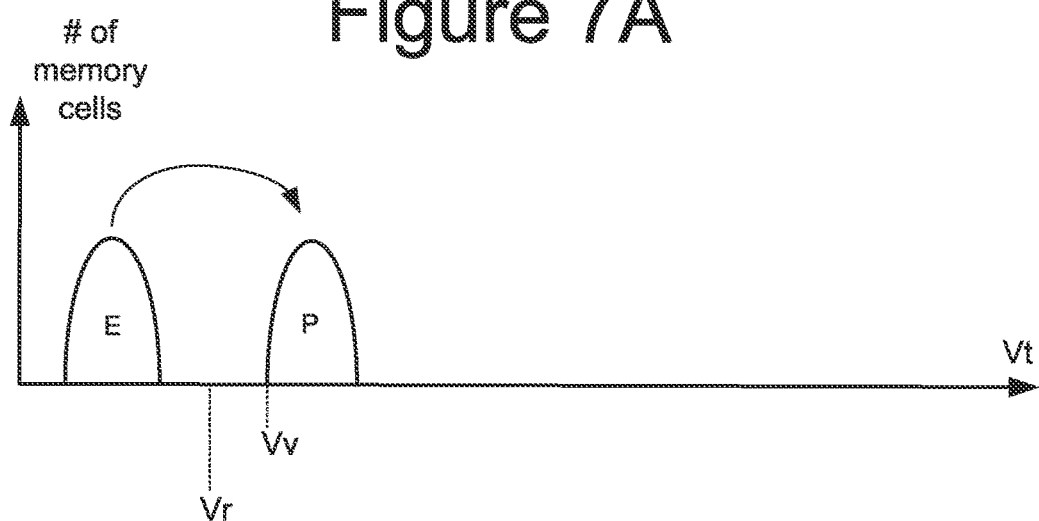
Figure 7B
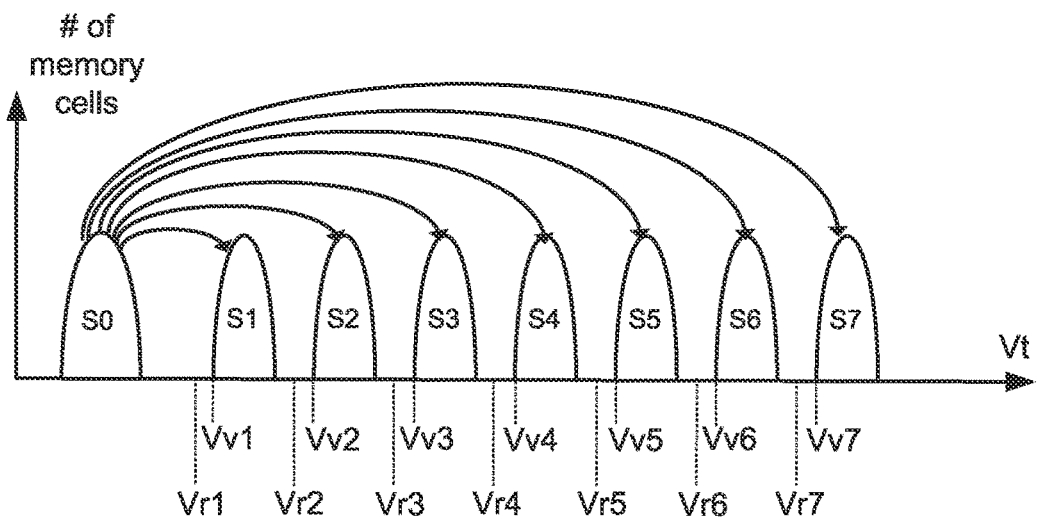
Figure 7C
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

NOISE REDUCTION IN SENSE AMPLIFIERS FOR NON-VOLATILE MEMORY

CLAIM OF PRIORITY

The present application claims priority from U.S. Provisional Patent Application No. 63/493,265, entitled "NOISE REDUCTION IN SENSE AMPLIFIERS FOR NON-VOLATILE MEMORY," by Lu et al., filed Mar. 30, 2023, incorporated by reference herein in its entirety.

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed.

BRIEF DESCRIPTION OF THE DRAWINGS

Like-numbered elements refer to common components in the different figures.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

DETAILED DESCRIPTION

Non-volatile memory devices employ sense amplifier circuits to determine the data state of memory cells, such as in data read and program verify operations. A number of designs for sense amplifiers to sense the resistance or threshold values of a memory cell are known. For example, a sensing node within the sense amplifier can be pre-charged and connected to a selected memory to determine the extent to which the sensing node discharges. A sense amplifier will typically have a number of associated data latches to hold results of sensing operations, with multi-level cell (MLC) memory designs having multiple data latches associated with a sense amplifier circuit. In the course of memory operations, data values are often moved between the various data latches and the sensing node. Accurate operation of the memory device relies upon accurately transferring the data values when they are transferred between different part of the sense amplifier. However, noise in the sense amplifier can corrupt these values, particularly in memory devices with lower operating voltages.

To improve performance of sense amplifier operations, the following presents techniques to reduce noise in sense amplifier circuits during internal transfer of data values. One set of aspects addresses noise from parasitic capacitances that can affect the transfer of a data value from a data latch to the sensing node. To transfer the data value, the sensing node is pre-charged and the data value used to set the control gate voltage on a transistor in a discharge path for the sensing node. In the discharge path, the transistor is connected in series with a switch, so that when the switch is turned on, the data value on the transistor's control gate will determine whether or not the sensing node discharges. To reduce noise in the process, before the data value is used to bias the discharge path transistor's control gate, a node between the transistor and the switch is charged. Additionally, a lower voltage level can be used to turn on the discharge path switch.

FIGS. 1A-6F describe one example of a storage system that can be used to implement the technology disclosed herein.

Figure 1A:
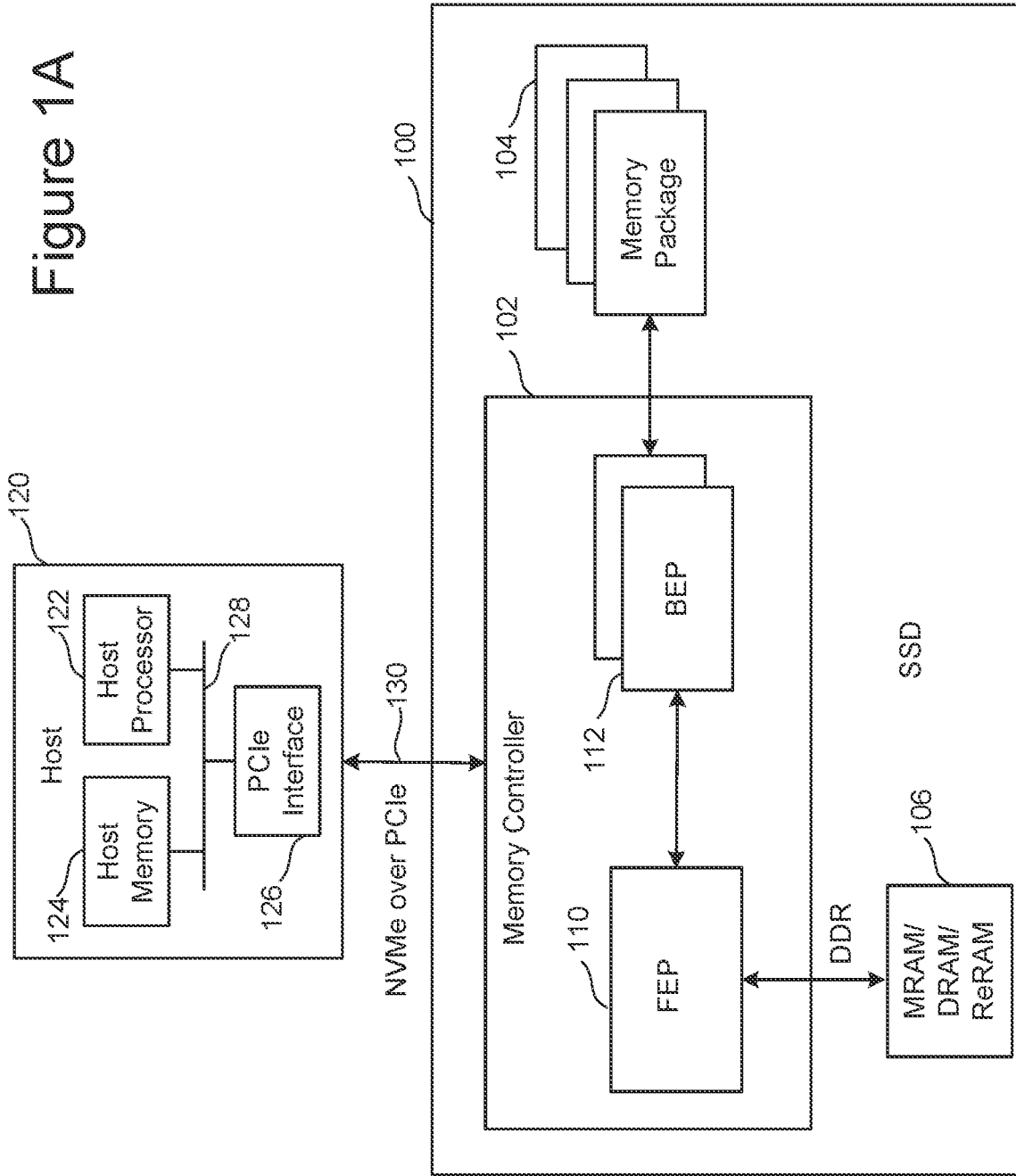
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, crase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
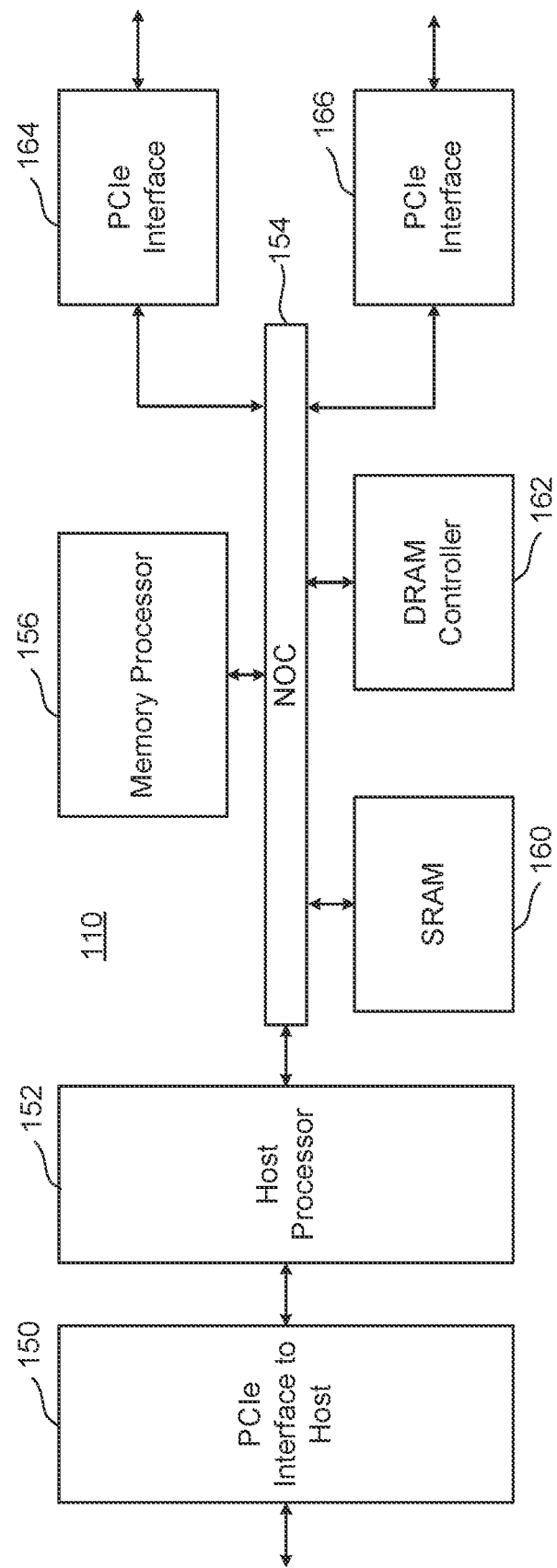
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
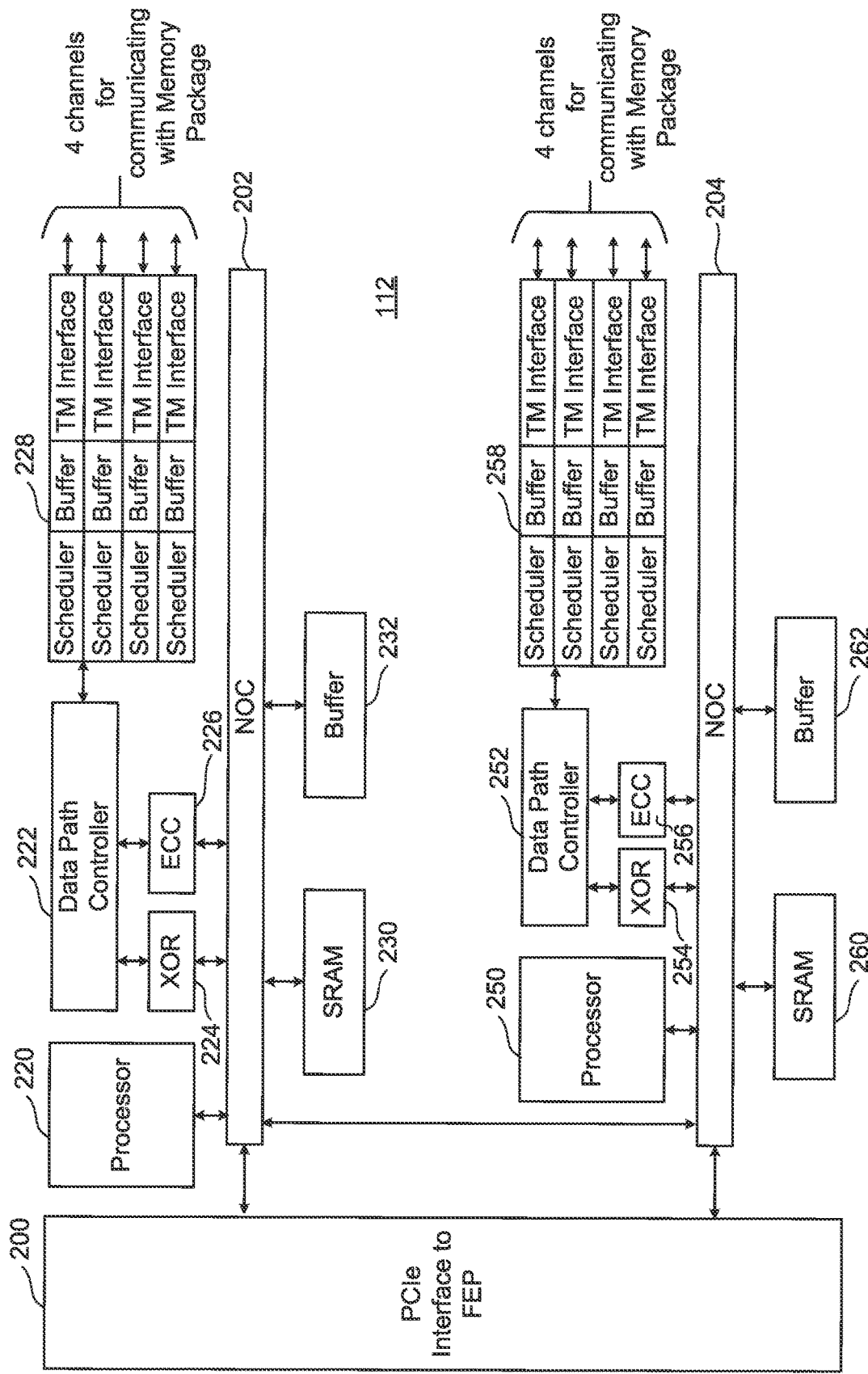
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
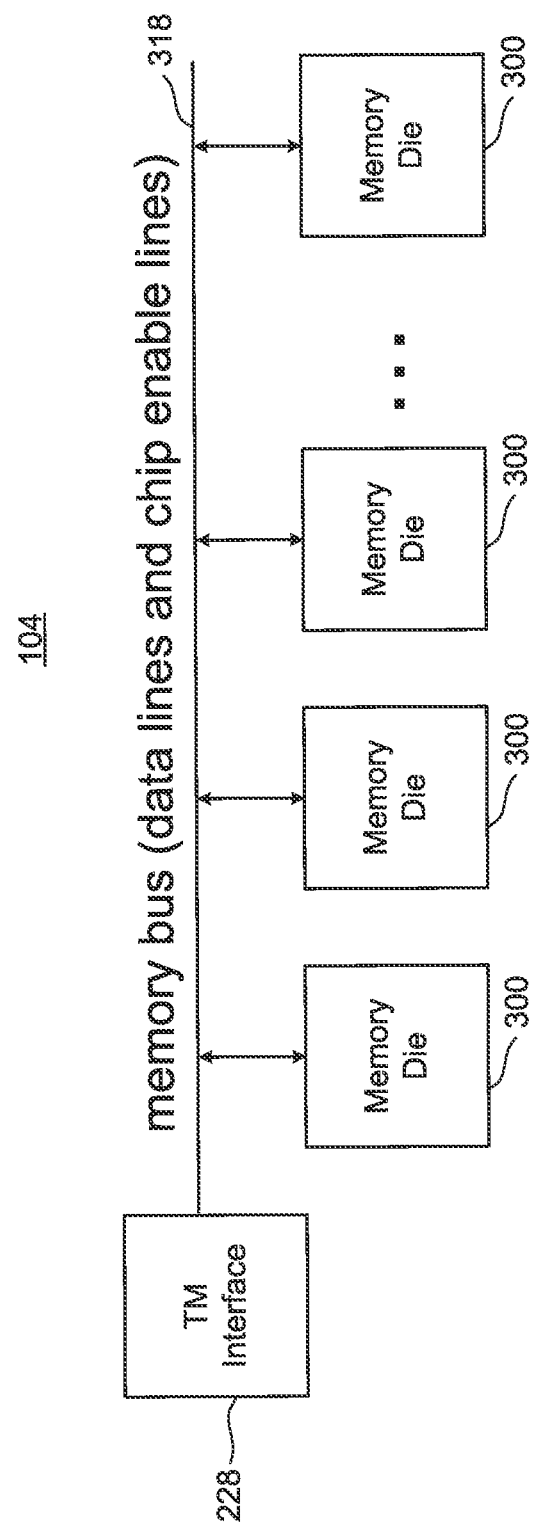
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
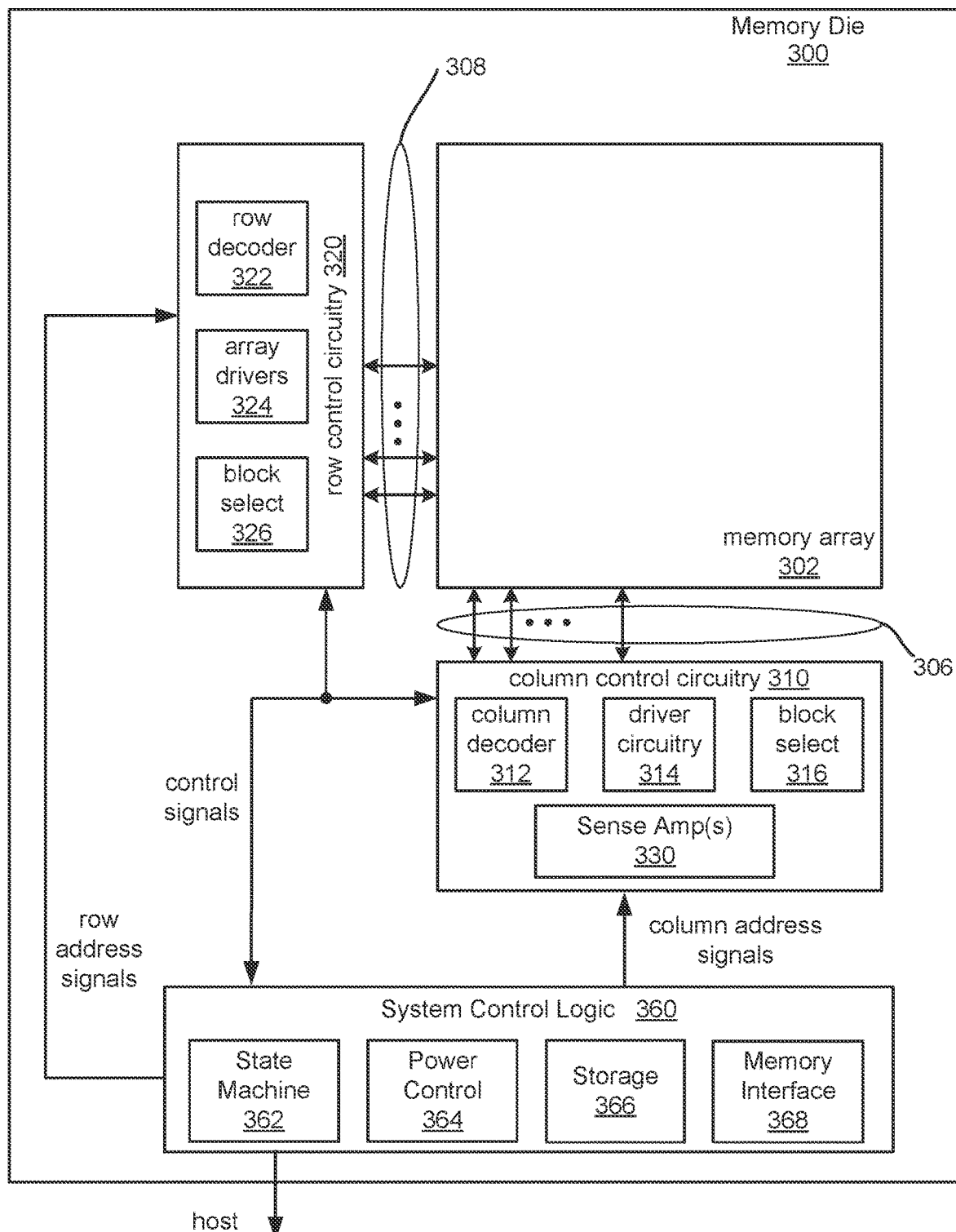
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
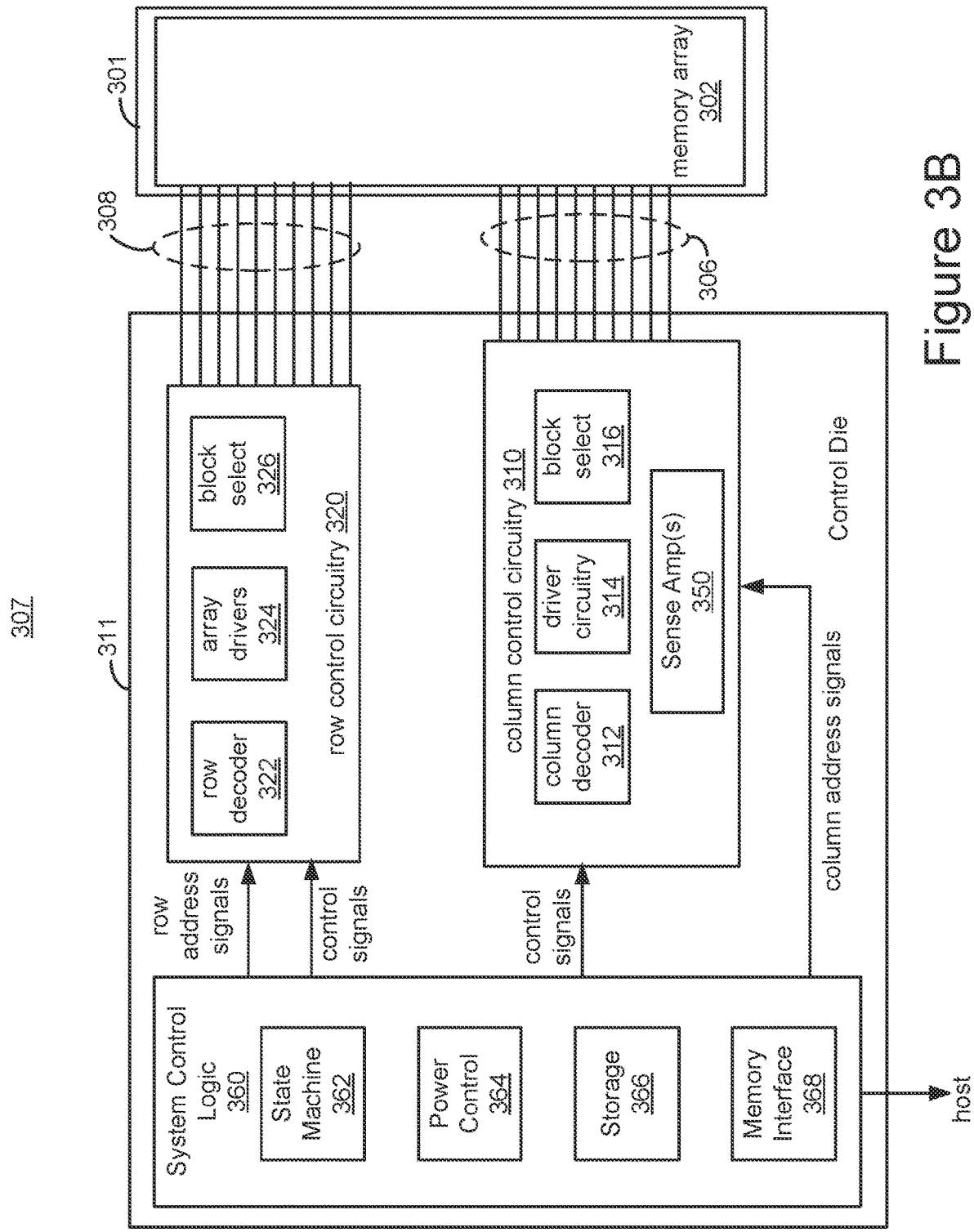
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4A:
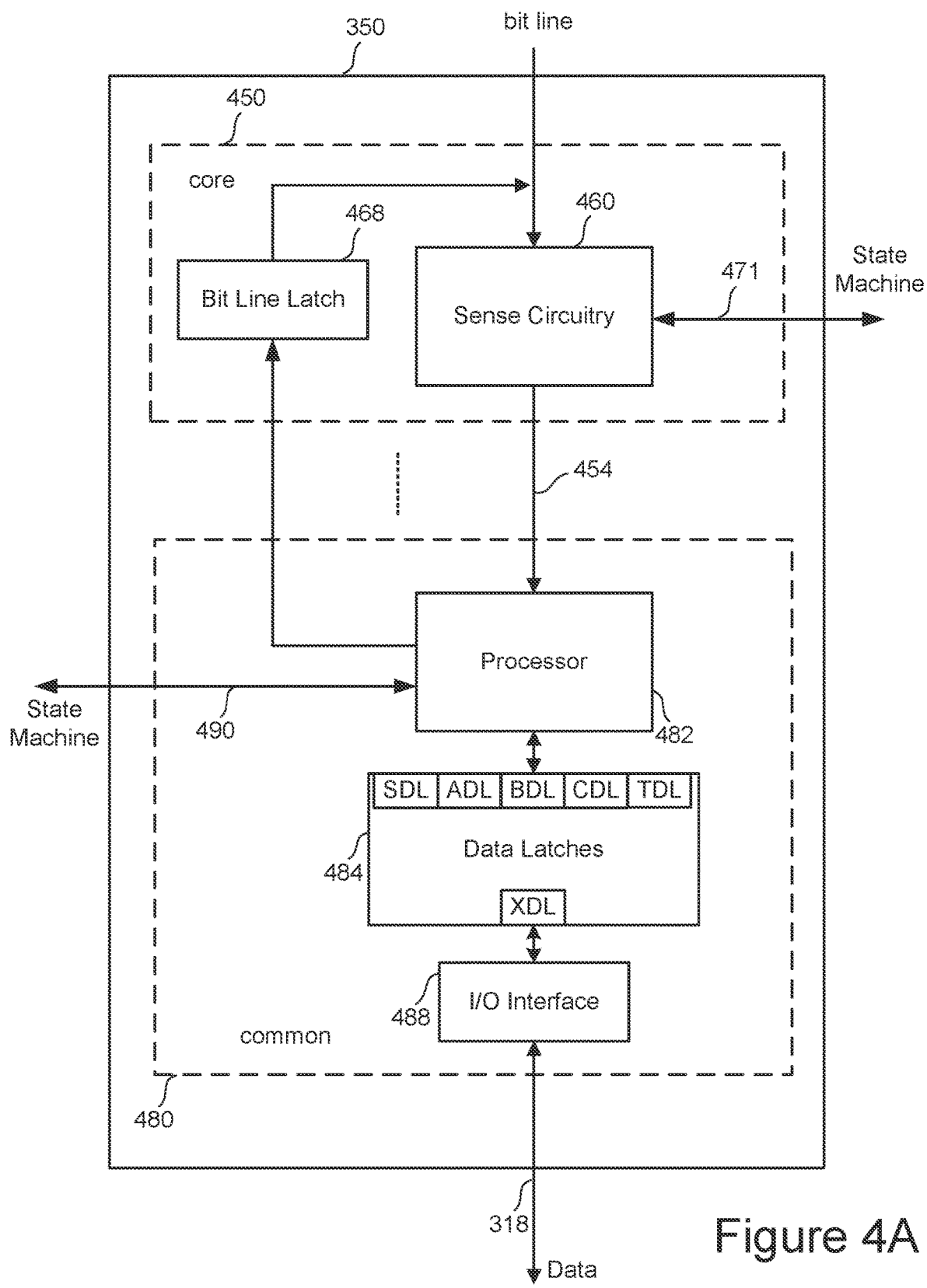
FIG. 4A is a block diagram of an individual sense block partitioned into a core portion and a common portion.

FIG. 4A is a block diagram of an individual sense block of sense amplifiers 350 partitioned into a core portion, referred to as a sense module 480, and a common portion 480. In one embodiment, there will be a separate sense module 450 for each bit line and one common portion 480 for a set of multiple sense modules 450. In one example, a sense block will include one common portion 480 and eight sense, twelve, or sixteen modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is to received control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., VDD).

Common portion 480 comprises a processor 468, a set of data latches 484 and an I/O Interface 488 coupled between the set of data latches 484 and data bus 318. Processor 482 performs computations. For example, one of its functions is to determine the data stored in the sensed memory cell and store the determined data in the set of data latches. The set of data latches 484 is used to store data bits determined by processor 468 during a read operation. It is also used to store data bits imported from the data bus 318 during a program operation. The imported data bits represent write data meant to be programmed into the memory. I/O interface 488 provides an interface between data latches 484 and the data bus 318.

During read or sensing, the operation of the system is under the control of state machine 362 that controls (using power control 364) the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 468 via bus 454. At that point, processor 468 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latch stack 484 contains a stack of data latches corresponding to the sense module. In one embodiment, there are three, four or another number of data latches per sense module 450. In one embodiment, the latches are each one bit. In this document, the latches in one embodiment of data latch stack 484 will be referred to as SDL, XDL, ADL, BDL, and CDL. In the embodiments discussed here, the latch XDL is a transfer latch used to exchange data with the I/O interface 488. In addition to a first sense amp data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while a 4-bit per cell MLC embodiment might include a further set of DDL latches. In other embodiments, the XDL latches can be used to hold additional pages of data, such as a 4-bit per cell MLC embodiment the uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate. In embodiments discussed below, the latches ADL, BDL, . . . can transfer data between themselves and the bit line latch 468 and with the transfer latch XDL, but not directly with the I/O interface 488, so that a transfer from these latches to the I/O interface is transferred by way of the XDL latches.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 484 from the data bus 318. During the verify process, Processor 468 monitors the verified memory state relative to the desired memory state. When the two are in agreement, processor 468 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 4B:
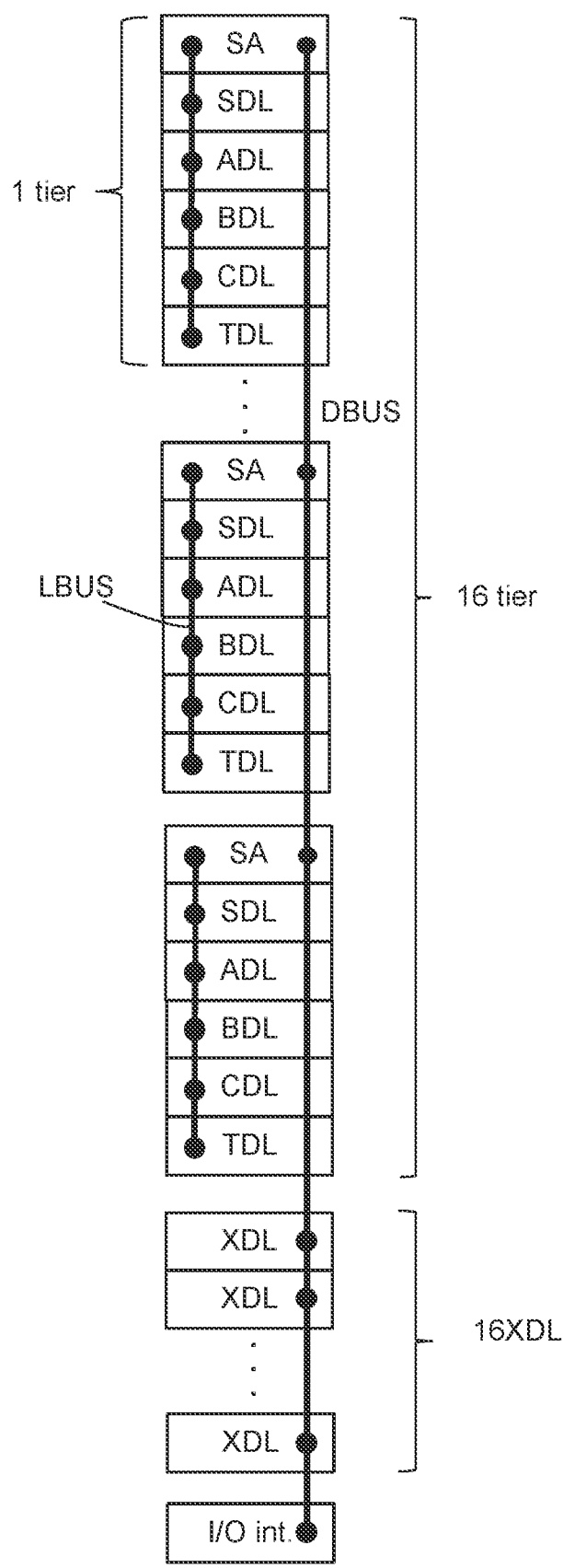
FIG. 4B is a schematic representation of one embodiment for the structure of the data latches.

FIG. 4B is a schematic representation of the structure for one embodiment of the data latches. The example of FIG. 4B is for a 3 bit per cell embodiment where each sense amplifier (SA) has a set of associated data latches forming a "tier" including a sense amp data latch (SDL), the data latches for the 3 bit data states (ADL, BDL, CDL), and an auxiliary data latch (TDL) that could be used for implementing quick pass write operations, for example. In one set of embodiments for 4 bit data states, the XDL data latches can be used for a fourth page of data. Within each of these stacks of data latches, data can be transferred between the sense amplifier and its associated set of latches along a local bus LBUS. In some embodiments, each of the sense amplifiers and corresponding set of data latches of a tier that are associated with one bit line can be grouped together for a corresponding "column" of bit lines, and formed on a memory die within the pitch of the column of memory cells along the periphery of the memory cell array. The example discussed here uses an embodiment where 16 bit lines form a column so that a 16-bit word is physically located together in the array. An example of a memory array may have 1000 such columns, corresponding to 16K bit lines. In the topology of the FIG. 4B embodiment, each sense amplifier and its set of associated data latches of a tier are connected along an internal bus structure of DBUSs along which data can be transferred between each of the tier of latches and a corresponding XDL. For the embodiment described in the following, the XDL transfer latches can transfer data to and from the I/O interface, but the other data latches of the tier (e.g., ADL) are not arranged to transfer data directly to or from the I/O interface and must go through the intermediary of the transfer data latch XDL.

Figure 5A:
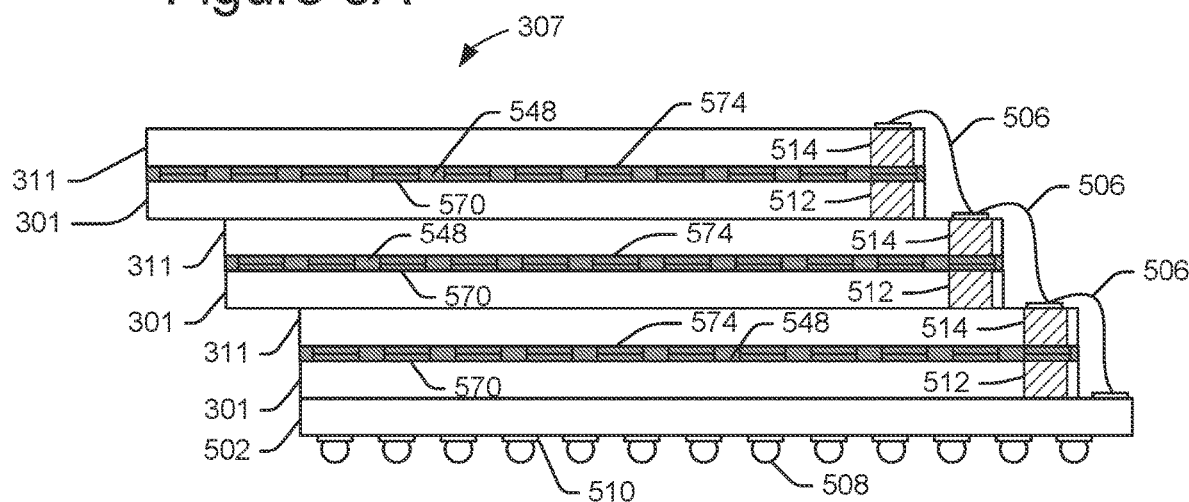
FIG. 5A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 5A depicts a side view of an embodiment of an integrated memory assembly 307 stacked on a substrate 502 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 570, 574, are depicted. There may be many more bond pads. A space between two dies 301, 311 that are bonded together is filled with a solid layer 548, which may be formed from epoxy or other resin or polymer. This solid layer 548 protects the electrical connections between the dies 301, 311, and further secures the dies together. Various materials may be used as solid layer 548, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 506 connected to the bond pads connect the control die 311 to the substrate 502. A number of such wire bonds may be formed across the width of each control die 311 (i.e., into the page of FIG. 5A).

A memory structure die through silicon via (TSV) 512 may be used to route signals through a memory structure die 301. A control die through silicon via (TSV) 514 may be used to route signals through a control die 311. The TSVs 512, 514 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package. The solder balls 508 may form a part of the interface between the integrated memory assembly 307 and the memory controller 102.

Figure 5B:
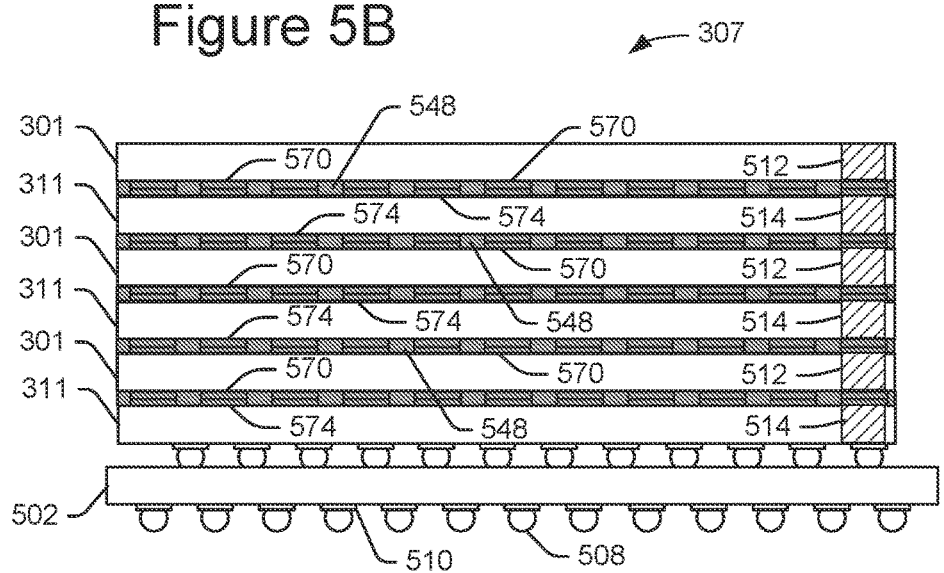
FIG. 5B depicts a side view of an embodiment of an integrated memory assembly stacked on a substrate.

FIG. 5B depicts a side view of an embodiment of an integrated memory assembly 307 stacked on a substrate 502. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 570, 574 are depicted. There may be many more bond pads. A space between two dies 301, 311 that are bonded together is filled with a solid layer 548, which may be formed from epoxy or other resin or polymer. In contrast to the example in FIG. 5A, the integrated memory assembly 307 in FIG. 5B does not have a stepped offset. A memory structure die through silicon via (TSV) 512 may be used to route signals through a memory structure die 301. A control die through silicon via (TSV) 514 may be used to route signals through a control die 311.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6A:
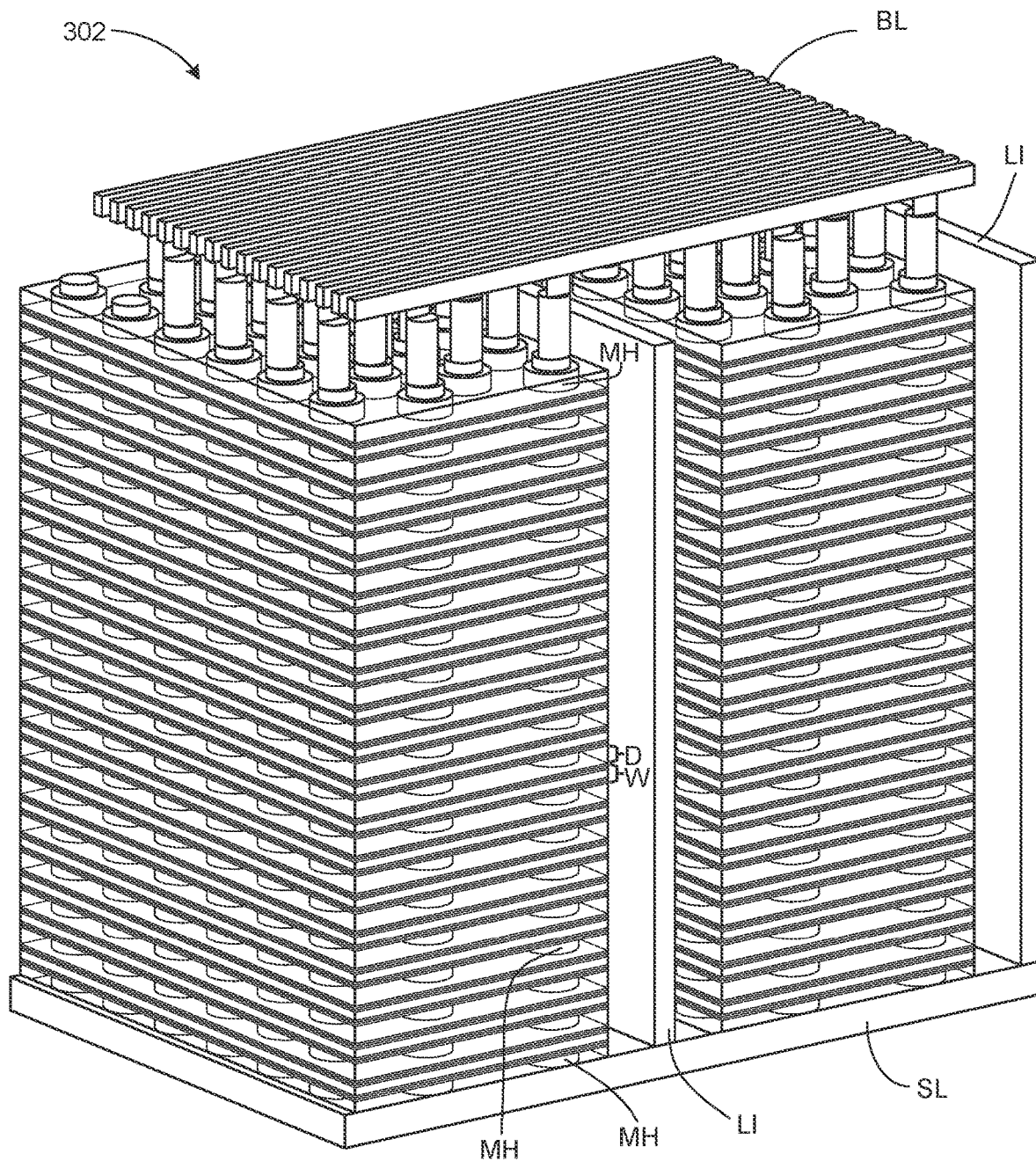
FIG. 6A is a perspective view of a portion of one example embodiment of a monolithic three dimensional memory array that can comprise memory structure.

FIG. 6A is a perspective view of a portion of one example embodiment of a monolithic three dimensional memory array that can comprise memory structure 302, which includes a plurality non-volatile memory cells. For example, FIG. 6A shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6B:
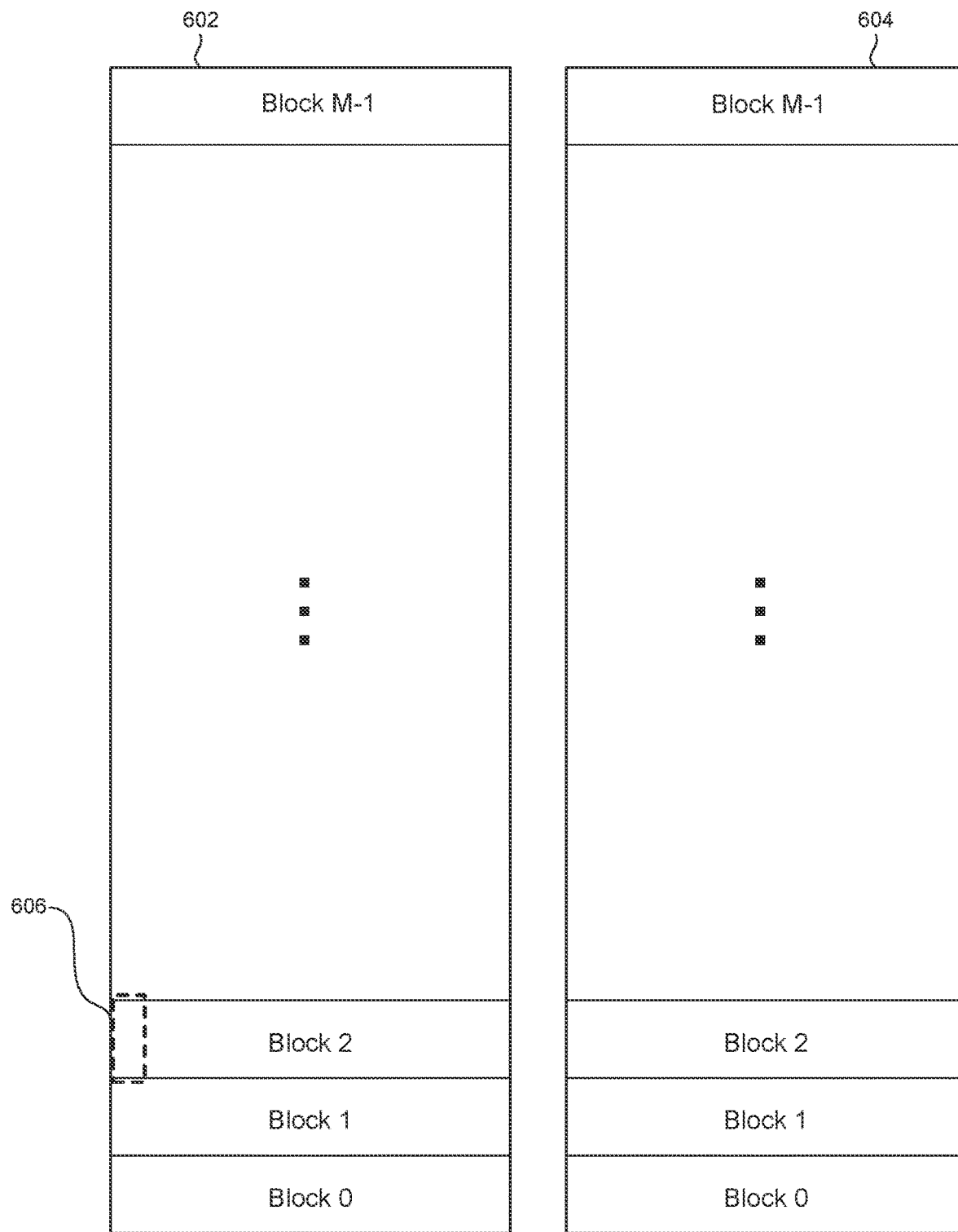
FIG. 6B is a block diagram explaining one example organization of memory structure.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, ... and plane 604 includes blocks 1, 3, 5, 7, .... In on embodiment, a block of memory cells is a unit of erase. That is, all memory cells of a block are erased together. In other embodiments, memory cells can be grouped into blocks for other reasons, such as to organize the memory structure 302 to enable the signaling and selection circuits.

Figure 6C:
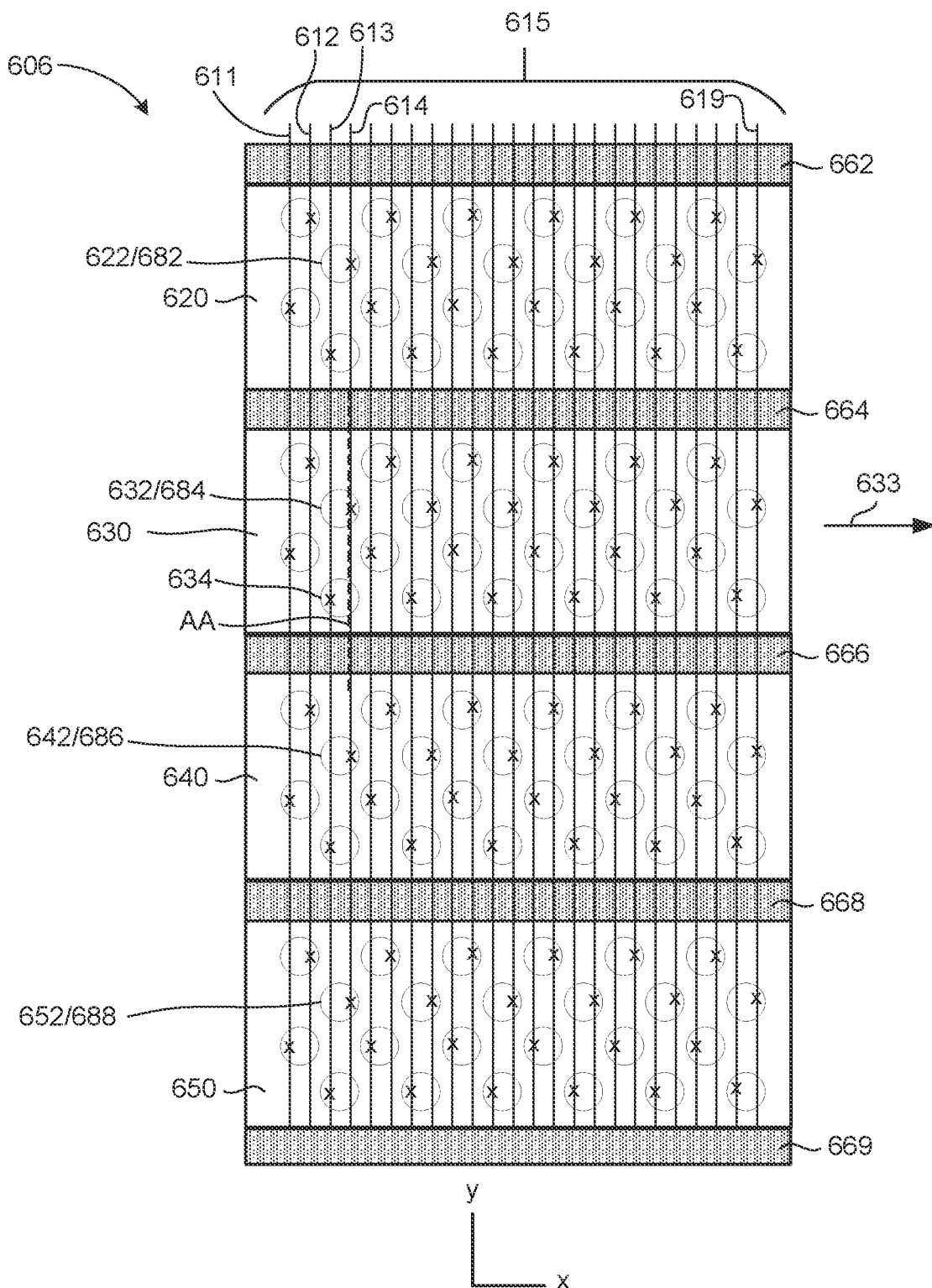
FIG. 6C is a block diagram depicting a top view of a portion of one block from the memory structure.
Figure 6D:
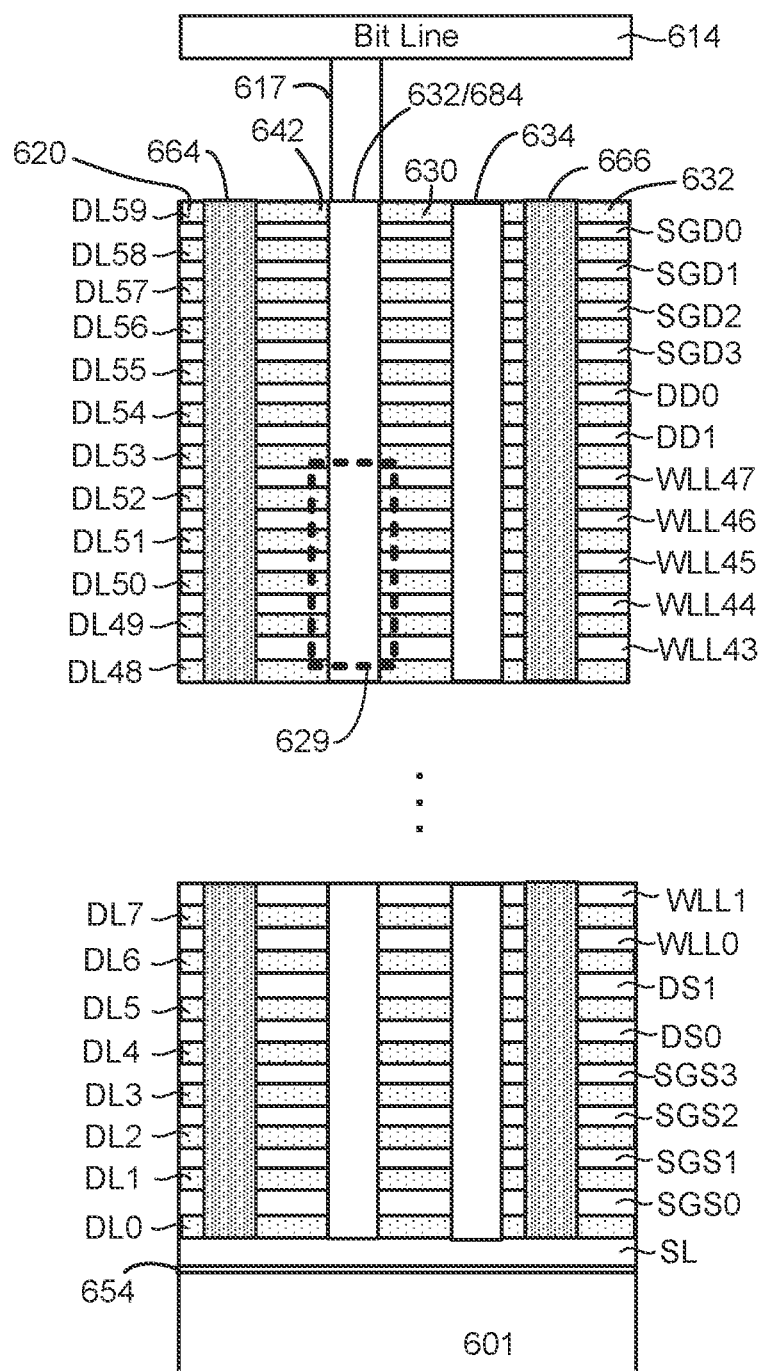
FIG. 6D depicts a portion of an embodiment of three dimensional memory structure showing a cross-sectional view along line AA of FIG. 6C.
Figure 6E:
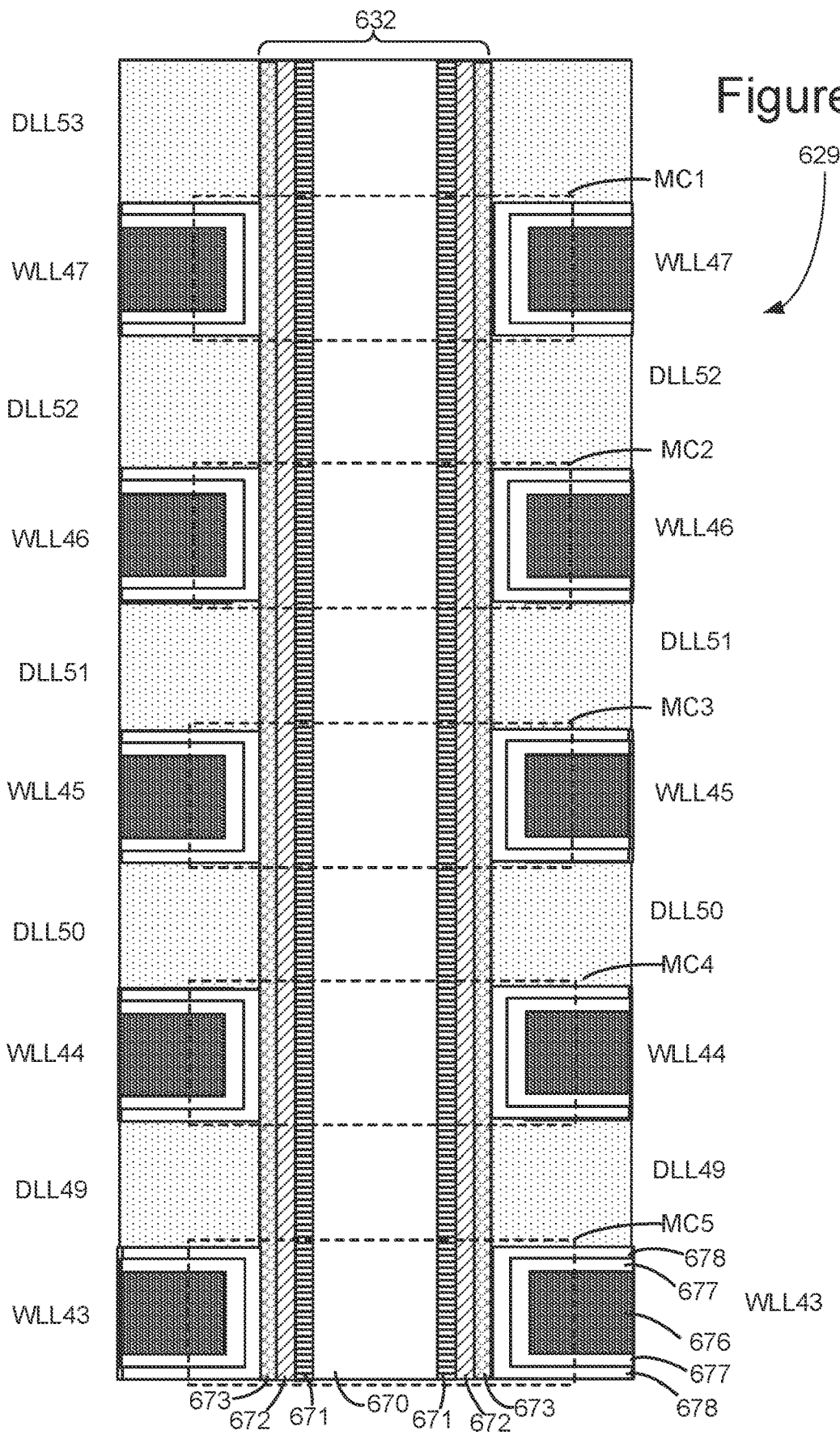
FIG. 6E depicts a cross sectional view of region of FIG. 6D that includes a portion of a vertical column.

FIGS. 6C-6E depict an example 3D NAND structure. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of 633. In one embodiment, the memory array will have 60 layers. Other embodiments have less than or more than 60 layers. However, FIG. 6C only shows the top layer.

FIG. 6C depicts a plurality of circles that represent the vertical columns. Each of the vertical columns includes multiple select transistors and multiple memory cells. In one embodiment, each vertical column implements a NAND string. For example, FIG. 6C depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6C extends in the direction of arrow 633 and in the direction of arrow 633, the block includes more vertical columns than depicted in FIG. 6C.

FIG. 6C also depicts a set of bit lines 615, including bit lines 611, 612, 613, 614, . . . , 619. FIG. 6C shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6C includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6C is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6C also shows the vertical columns being staggered. In other embodiments, different patterns of staggering can be used. In some embodiments, the vertical columns are not staggered.

FIG. 6D depicts a portion of an embodiment of three dimensional memory structure 302 showing a cross-sectional view along line AA of FIG. 6C. This cross sectional view cuts through vertical columns 632 and 634 and region 630 (see FIG. 6C). The structure of FIG. 6D includes four drain side select layers SGD0, SGD1, SGD2 and SGD3; four source side select layers SGS0, SGS1, SGS2 and SGS3; four dummy word line layers DD0, DD1, DS0 and DS1; and fortyeight data word line layers WLL0-WLL47 for connecting to data memory cells. Other embodiments can implement more or less than four drain side select layers, more or less than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 601, an insulating film 654 on the substrate, and source line SL. The NAND string of vertical column 632 has a source end at a bottom of the stack and a drain end at a top of the stack. As in agreement with FIG. 6C, FIG. 6D show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6C, the block is divided into four sub-blocks

620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

FIG. 6E depicts a cross sectional view of region 629 of FIG. 6D that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6E depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($SiO_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6F:
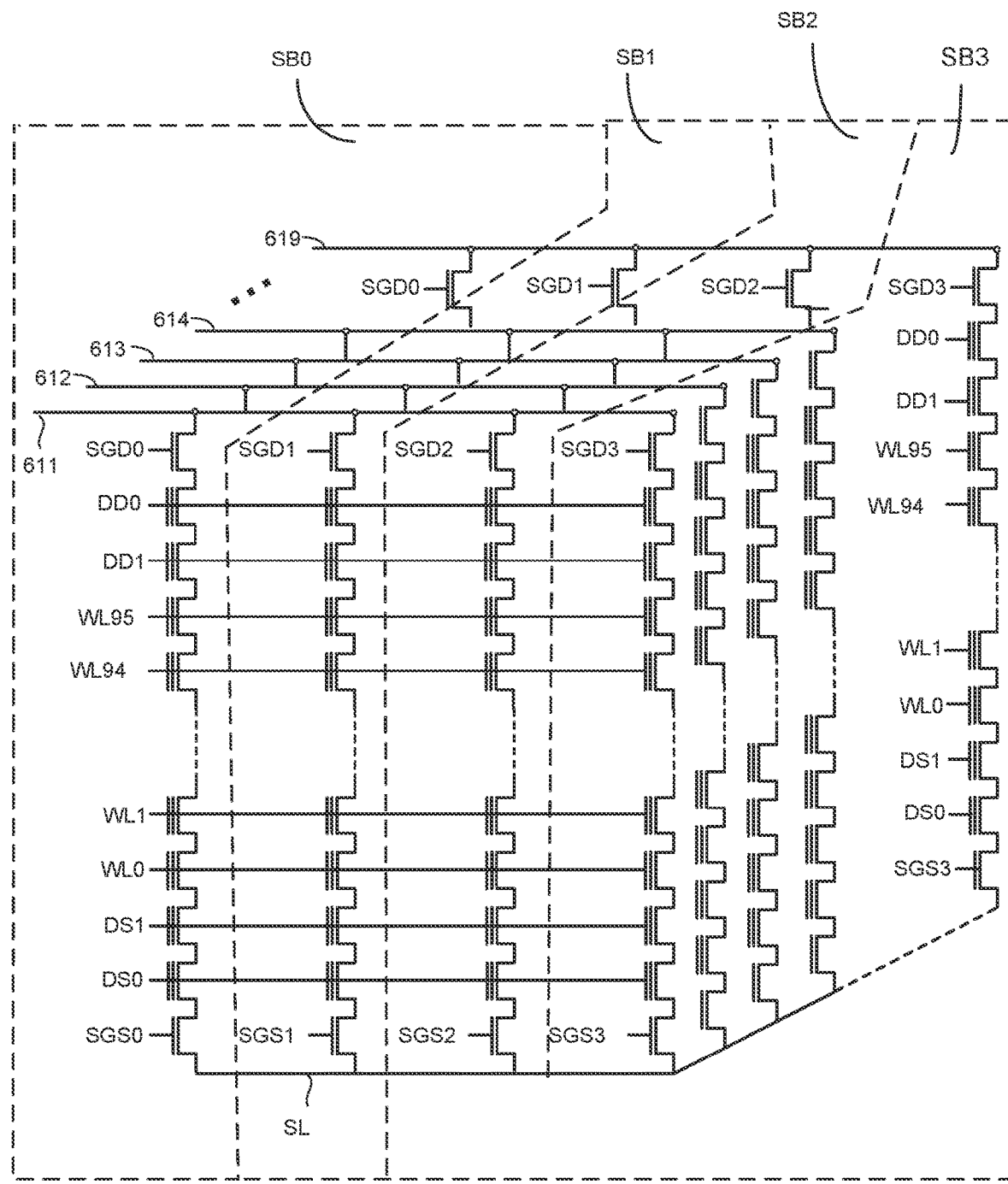
FIG. 6F is a schematic of a plurality of NAND strings showing multiple sub-blocks.

FIG. 6F is a schematic diagram of a portion of the memory depicted in FIGS. 6A-6E. FIG. 6F shows physical word lines WLL0-WLL95 running across the entire block. The structure of FIG. 6F corresponds to portion 606 in Block 2 of FIGS. 6A-6E, including bit lines 611, 612, 613, 614, . . . 619. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 6A-6F is a three dimensional memory structure that includes vertical NAND strings with charge-trapping material, other (2D and 3D) memory structures (e.g., MRAM, ReRAM, PCM) can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 7A is a graph of threshold voltage versus number of memory cells, and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with controller 122 relying on error correction to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. Referring back to FIG. 4A, in one embodiment the ADL, BDL, and CDL data latches can respectively be used for the lower, middle, and upper page data values of a memory cell during a program operation.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
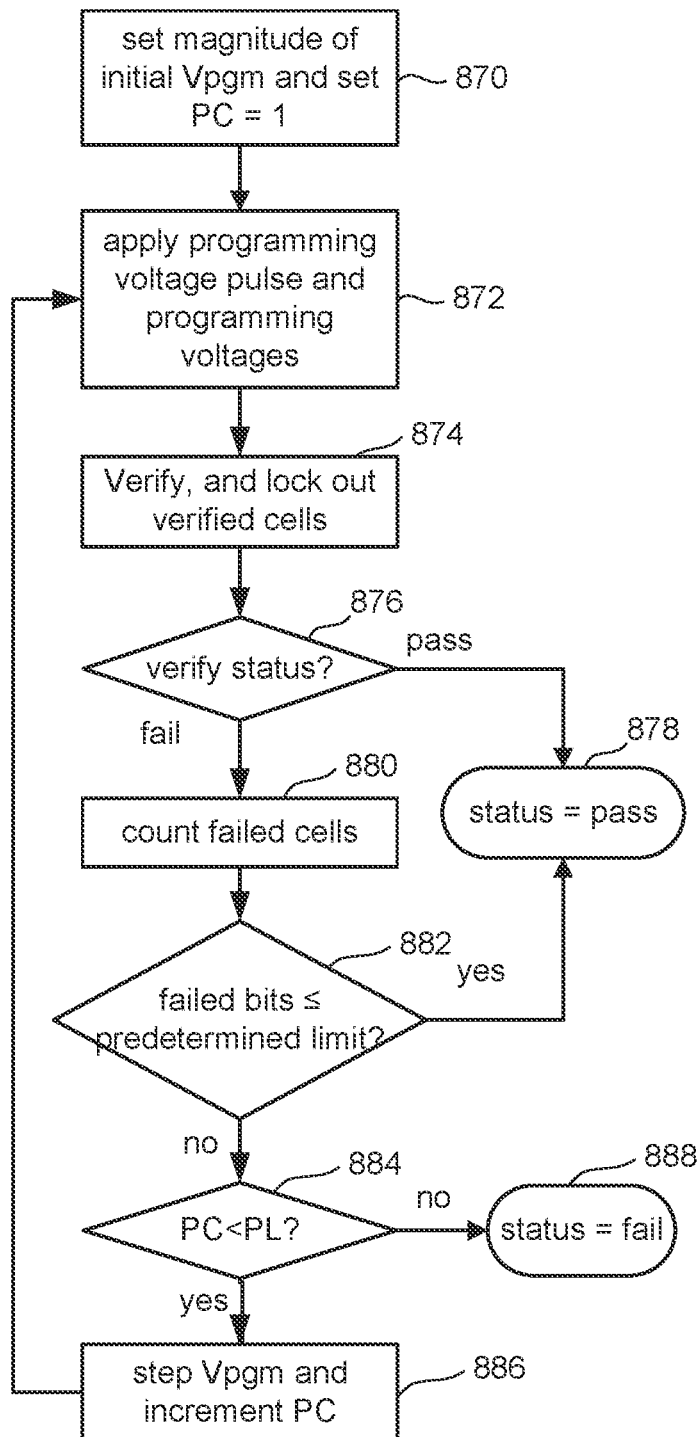
FIG. 8 is a flow chart describing one embodiment of a process for programming non-volatile memory.

FIG. 8 is a flowchart describing one embodiment of a process for programming that is performed by memory die 300/307. In one example embodiment, the process of FIG. 8 is performed on memory die 300/307 using the control circuit discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Figure 9:
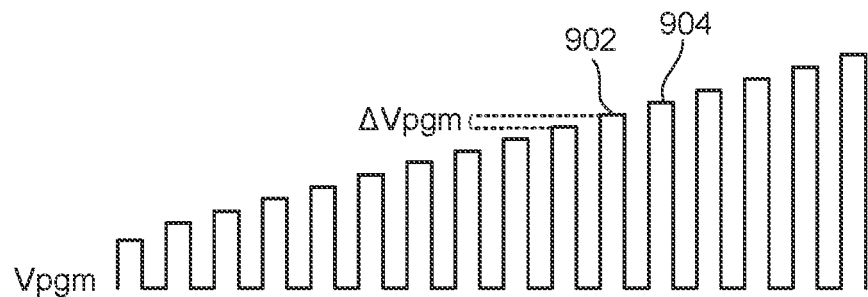
FIG. 9 depicts a series of programming voltage pulses.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size $\Delta Vpgm$ (e.g., 0.2 v-0.5 v). In step 870 of FIG. 8, the programming voltage (Vpgm) is initialized to the starting magnitude (e.g., ~12-16V or another suitable level) and a program counter PC maintained by state machine 362 is initialized at 1. In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to VDD (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the verify process. This counting can be done by the state machine 362, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop and a status of "PASS" is reported in step 878. In this situation, enough memory cells are programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 884 and the program counter PC is checked against the program limit value (PL). Examples of program limit values include 6, 20 and 30; however, other values can be used. If the program counter PC is not less than the program limit value PL, then the program process is considered to have failed, and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 302. The informational bits are represented by the matrix i=[1 0] (note that two bits are used for example purposes only, and many embodiments have code words longer than two bits). An error correction coding process (such as any of the processes mentioned above or below) is implemented by ECC engine 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. Mackay, Information Theory, Inference and Learning Algorithms, Cambridge University Press 2003, chapter 47. In practice, such LDPC codes are typically applied (e.g., by ECC engine 226/256) to multiple pages encoded across a number of storage elements, but they do not need to be applied across multiple pages. The data bits can be mapped to a logical page and stored in memory structure 302 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 10:
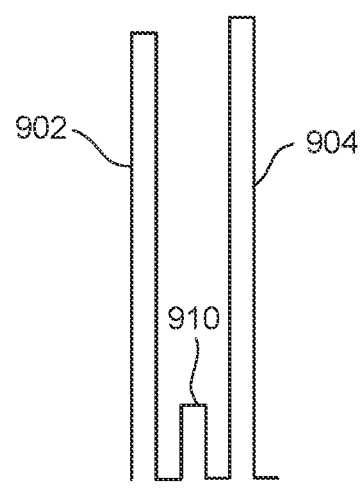
FIG. 10 depicts two programming voltage pulses and a verify voltage pulse.
Figure 11:
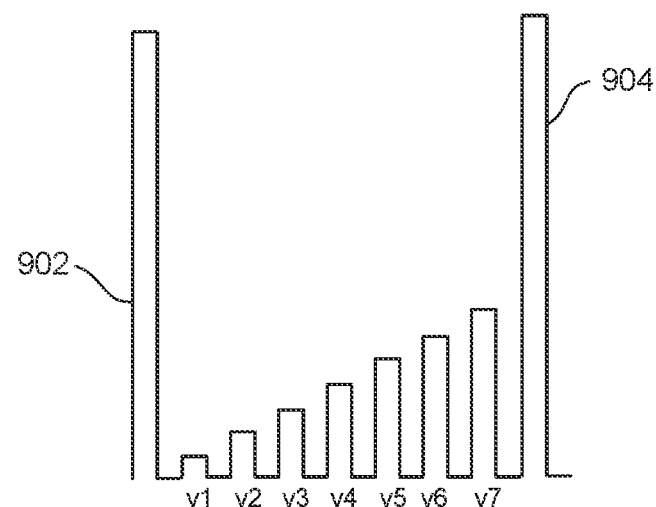
FIG. 11 depicts two programming voltage pulses and a set of verify voltage pulses.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

FIG. 11, which illustrates an embodiment in which memory cells store three bits of data per memory cell, depicts two of the programming voltage pulses 902 and 904 of FIG. 9. Between programming voltage pulses 902 and 904 are verify voltage pulses v1, v2, v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

Figure 12:
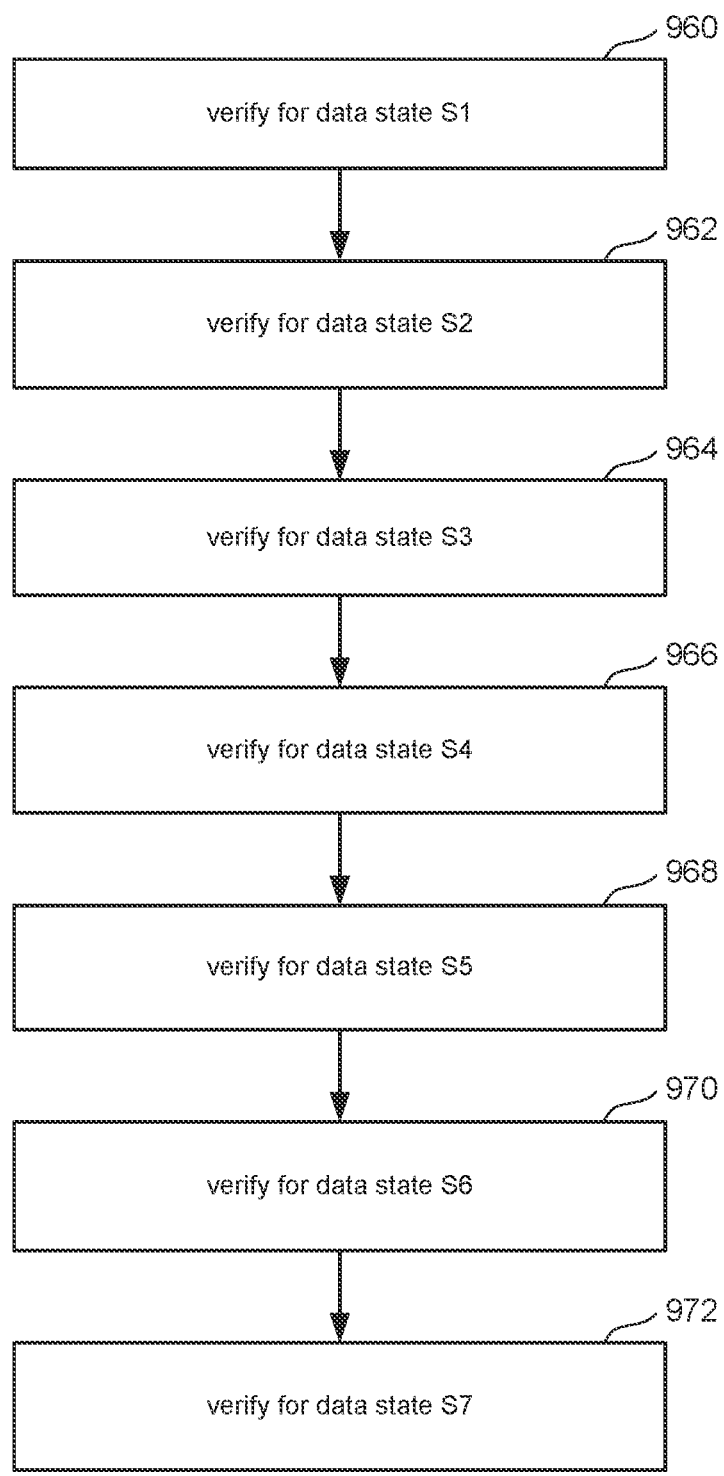
FIG. 12 is a flow chart describing one embodiment of a process for verifying programming of non-volatile memory.

FIG. 12 is a flow chart describing one embodiment of a process for verifying programming of non-volatile memory. That is, the process of FIG. 12 is a process performed during an example implementation of step 874 of FIG. 8 for an embodiment in which memory cells store three bits of data per memory cell. The process of FIG. 12 is performed using the waveforms of FIGS. 9 and 11. In step 960 of FIG. 12, the system performs verification for data state S1. For example, the system tests whether memory cells being programmed to data state S1 have threshold voltages greater than Vv1 (e.g., applying verify voltage pulse v1 of FIG. 11 to the control gates of memory cells being programmed to data state S1).

In step 962, the system performs verification for data state S2. For example, the system tests whether memory cells being programmed to data state S2 have threshold voltages greater than Vv2 (e.g., applying verify voltage pulse v2 of FIG. 11 to the control gates of memory cells being programmed to data state S2).

In step 964, the system performs verification for data state S3. For example, the system tests whether memory cells being programmed to data state S3 have threshold voltages greater than Vv3 (e.g., applying verify voltage pulse v3 of FIG. 11 to the control gates of memory cells being programmed to data state S3).

In step 966, the system performs verification for data state S4. For example, the system tests whether memory cells being programmed to data state S4 have threshold voltages greater than Vv4 (e.g., applying verify voltage pulses v4 of FIG. 11 to the control gates of memory cells being programmed to data state S4).

In step 968, the system performs verification for data state S5. For example, the system tests whether memory cells being programmed to data state S5 have threshold voltages greater than Vv5 (e.g., applying verify voltage pulses v5 of FIG. 11 to the control gates of memory cells being programmed to data state S5).

In step 970, the system performs verification for data state S6. For example, the system tests whether memory cells being programmed to data state S6 have threshold voltages greater than Vv6 (e.g., applying verify voltage pulse v6 of FIG. 11 to the control gates of memory cells being programmed to data state S6).

In step 972, the system performs verification for data state S7. For example, the system tests whether memory cells being programmed to data state S7 have threshold voltages greater than Vv7 (e.g., applying verify voltage pulse v7 of FIG. 11 to the control gates of memory cells being programmed to data state S7). Note that, in one embodiment, steps 960-972 are performed between doses of programming (e.g., between programming voltage pulses). In some embodiments, one or more of steps 960-972 can be skipped between certain programming voltage pulses. In one embodiment, steps 960-972 are performed sequentially (in any order or in the order depicted), while in other embodiments steps 960-972 are performed in parallel (e.g., concurrently).

The flow of FIG. 12 illustrates the verification of all of the target data states, but to speed up the verification phase of a programming operation a "smart verify" operation can be used. In a smart verify, not all of the target data state levels are checked. Initially, for the first few programming pulses, only the lower data states need to be checked. As the programming operation continues, as the lower target data states begin to verify, additional higher data states are included; and, as the lower states finish, the lower target state verifies can be dropped out.

An important aspect for the performance of a non-volatile memory device is the speed with which sensing operations, both for reads and program verifies, can be performed and the speed and accuracy with which data can be transferred into and out of the data latches associated with the sense amplifiers. In one set of embodiments, the data latches 484 of the sense amplifier structure of FIG. 4A are connected along local buses LBS and external buses DBUS as illustrated schematically in the latch structure of FIG. 4B. As discussed above, based on the structure of FIG. 4B, there will be a number of circumstances where data is transferred between the transfer data latches XDL and the internal data latches SDL/ADL/BDL/CDL/TDL through the sense amplifier SA. For example, this can occur when read data or write data is transferred between the internal data latches and, by way of XDL, to the I/O interface. Such transfers can also occur when XDL is used as an additional data latch to supplement the ADL/BDL/CDL data latches to allow memory operation storing a higher number of memory states, such as 4-level per cell operation rather than 3-level per cell operation. These transfers may also occur when logical operations are performed using the latched values. Consequently, it is important to be able to accurately and rapidly transfer data between the transfer data latches XDL and the internal data latches SDL/ADL/BDL/CDL/TDL through the sense amplifier SA. The following discussion considers techniques to improve the accuracy and efficiency of these transfers.

Figure 13:
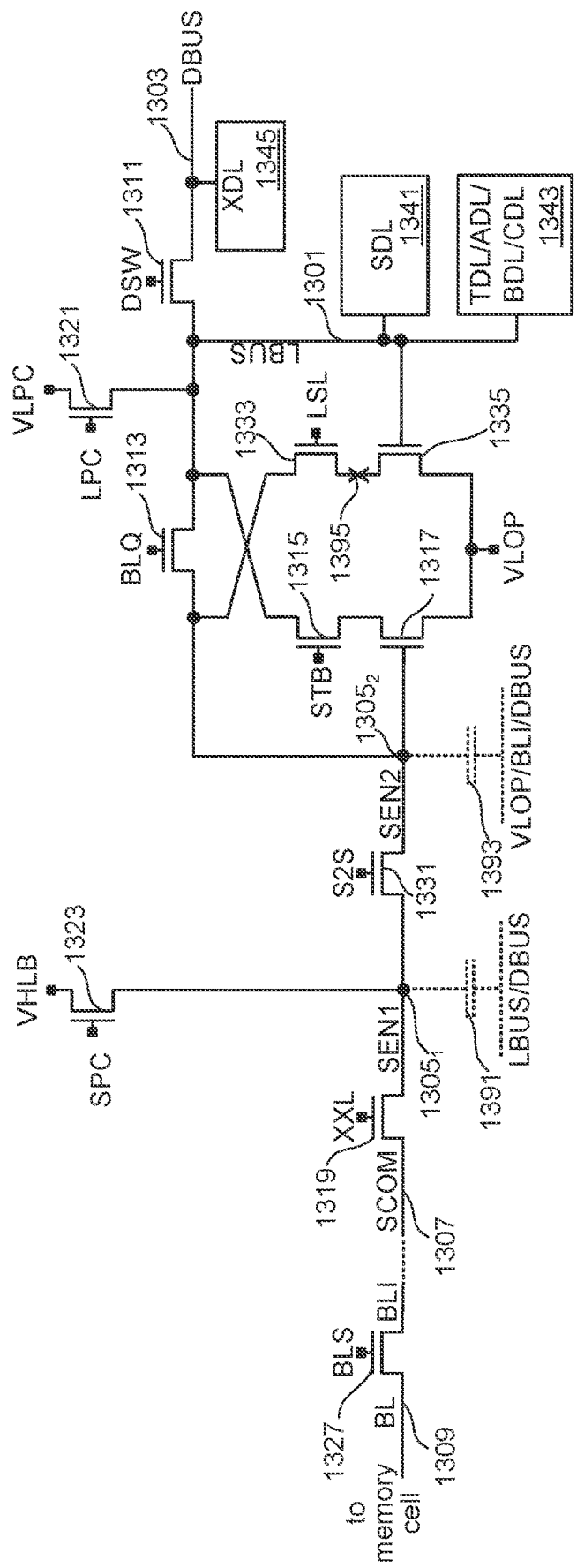
FIG. 13 illustrates an embodiment of a sense amplifier circuit and associated data latches.

FIG. 13 illustrates an embodiment of a sense amplifier circuit that can be used to determine the state of a memory cell. In the embodiment of FIG. 13, a memory cell's state is determined by pre-charging a sense line or node SEN 1305 to predetermined level, connecting the sense node to the bit line of a biased selected memory cell, and determining the extent to which the node SEN 1305 discharges over a sensing interval. In the embodiment of FIG. 13, the SEN node 1305 is made up of two parts, SEN1 $1305_1$ and SEN2 $1305_2$ connected through the switch S2S 1331 that allows SEN1 $1305_1$ and SEN2 $1305_2$ to either be connected to, or isolated from, each other for various operations. A number of variations are possible, depending on the embodiment, but the embodiment of FIG. 13 illustrates some typical elements. The node SEN1 $1305_1$ can be pre-charged to a level VHLB by way of switch SPC 1323. In FIG. 13, the notation for many of the MOSFET switches uses the same name for the transistor and the corresponding control signal, where the various control signals can be provided by processor 482, state machine 362, and/or other control elements of the embodiments of FIGS. 3A and 3B. The node SEN 1305 can be connected to a selected memory cell along a bit line BL 1309 by way of a switch XXL 1319 to a node SCOM 1307 and then, after possibly intervening elements, to an internal bit line BLI that connects to a bit line select switch BLS 1327 corresponding to the decoding and select circuitry of the memory device. The SEN2 node $1305_2$ is connected to the local data bus LBUS 1301 through switch BLQ 1313, which in turn can connect to the data DBUS 1303 by way of switch DSW 1311. A switch LPC 1321 can be pre-charged to a level VLPC, where the values of VHLB and VLPC depend on the particulars of the embodiment and specifics of the implementation.

In a sense operation, a selected memory cell is biased by setting its corresponding selected word line to a read voltage level as described above. In a NAND array implementation, the selected gates and the non-selected word lines of the selected word line's NAND string are also biased to be on. Once the array is biased, the selected memory cell will conduct at a level based on the relation of applied read voltage to the memory cell's threshold voltage. The SEN node 1305 is pre-charged through SPC 1323 is connected to the corresponding bit line 1309 of a selected memory by way XXL 1319 and BLS 1327 to the selected bit lines and allowed to discharge for a sensing interval to a level dependent on the threshold voltage of the memory cell relative to the voltage level applied to the control gate of the selected memory cell. At the end of the sensing interval, XXL 1319 can be turned off to trap the resultant charge on SEN 1305. The voltage level on SEN2 $1305_2$, which controls the degree to which the transistor 1317 is on, will reflect the data state of the selected memory cell relative the applied read voltage. The local data LBUS 1301 is also pre-charged, so that when the strobe transistor STB 1315 is turned on for a strobing interval, LBUS will discharge to the VLOP node, that can be at 0V or other low level, as determined by the voltage level on SEN 1305. At the end of the strobe interval, STB 1315 is turned off to set the sensed value on LBUS and the result can be latched into one of the latches SDL 1341 or TDL/ADL/BDL/CDL 1343 along LBUS 1301 or XDL 1345 along DBUS.

Figures 14A, 14B:
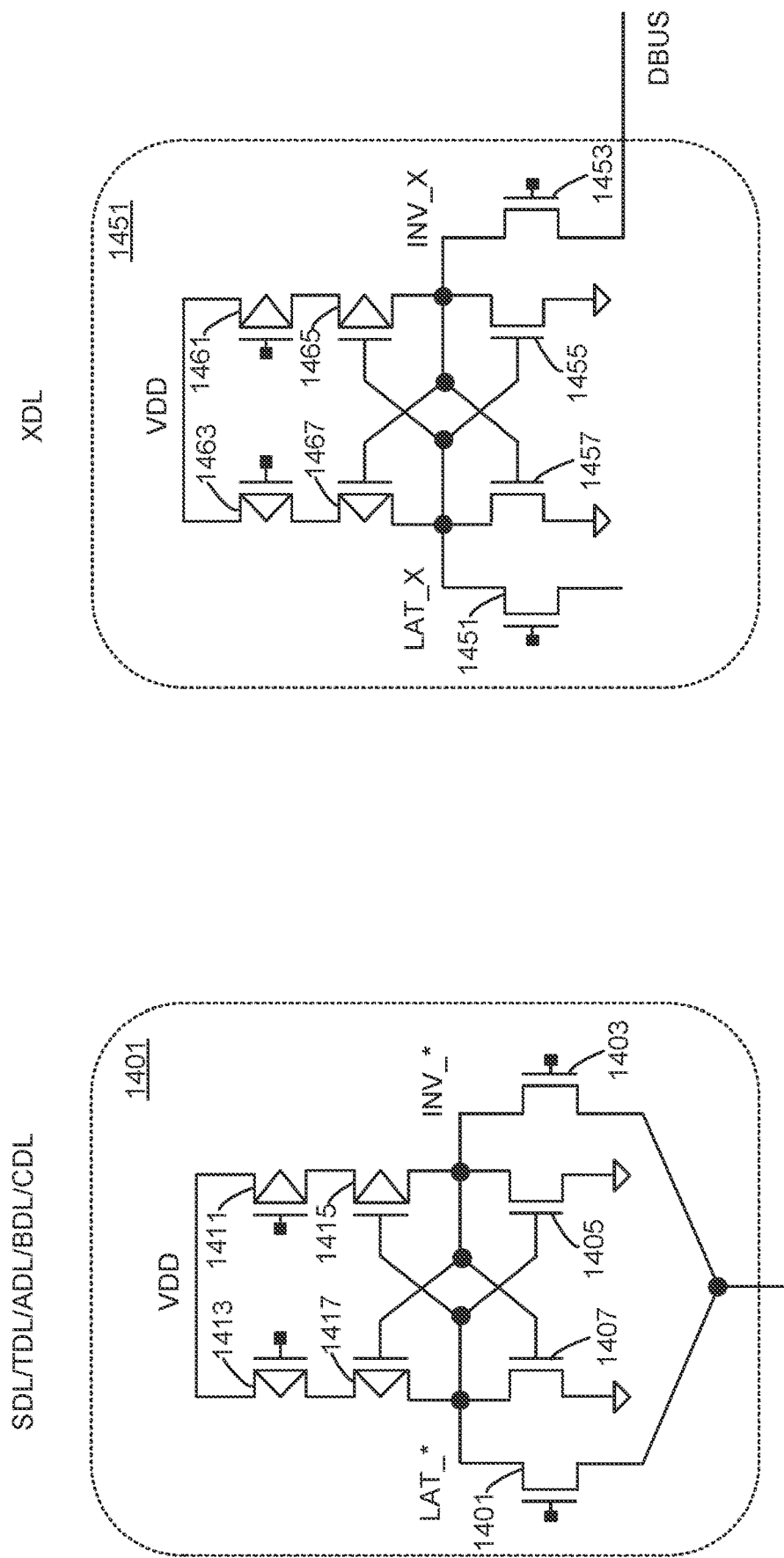
FIGS. 14A and 14B respectively illustrate an embodiment for the latches connected along the local data bus and an embodiment for the transfer data latches.

FIGS. 14A and 14B respectively illustrate an embodiment for the latches connected along the local data bus and an embodiment for the transfer data latches. Each of the latches SDL. TDL, ADL, BDL, and CDL can use the structure of latch 1401 that has a left leg with the node LAT_* that can hold the latched value and a right leg with a node INV_* that can hold the inverse of the latched value, where the * would correspond to the particular latch using the structure of latch 1401 (i.e., LAT_S for SDL, LAT_A for ADL, etc.). In FIGS. 14A and 14B, the legs are connected between VDD and ground, but in some embodiments some of the latches can be connected to a different high level other than VDD. Connected in series between VDD and ground in the left leg of latch 1401 are PMOS 1413, PMOS 1417, and NMOS 1407, with the node LAT_* between PMOS 1417 and NMOS 1407. Connected in series between VDD and ground in the right leg of latch 1401 are PMOS 1411, PMOS 1415, and NMOS 1405, with the node INV_* between PMOS 1415 and NMOS 1405. To latch the stored value, the gates of PMOS 1417 and NMOS 1407 are cross-coupled to node INV_* and the gates of PMOS 1415 and NMOS 1405 are cross-coupled to node LAT_*. Both of LAT_* and INV_* are connectable to LBUS by way of respective NMOS switch 1401 or 1403, so that either the value latched on LAT_* or its invers INV_* can be provided to the LBUS.

The latch XDL 1451 of FIG. 14B can constructed similarly to latch 1401 of FIG. 14A, with: a left leg of series connected PMOS 1463, PMOS 1467, and NMOS 1457, with the node LAT_X between PMOS 1467 and NMOS 1457; a right leg of series connected PMOS 1461, PMOS 1465, and NMOS 1455, with the node INV_X between PMOS 1465 and NMOS 1455; and the gates of PMOS 1467 and NMOS 1457 are cross-coupled to node INV_X and the gates of PMOS 1465 and NMOS 1455 are cross-coupled to node LAT_X. In this embodiment, DBUS is connectable to INV_X by NMOS switch 1453 and the NMOS switch 1451 is unused.

Concerning the use of the various latches associated within a given sense amplifier, the data latch SDL 1401 can be used to store a bit to determine whether the bit line should be program enabled or program inhibited. If the embodiment is a quick pass write embodiment, the TDL latch can be used to determine whether the bit line should be partially inhibited to allow programming, but at a slower rate. The ADL, BDL, ands CDL latches can be used to store to the bits of the target state of the upper, middle, and lower page value of a 3-bit per memory cell embodiment. In a sensing operation for performing a verify phase of a program loop, the target data is loaded into the ADL, BDL, and CDL latches and the resultant level on the SEN or LBUS nodes is checked against the stored target data by forming various logical combinations of the latched ADL, BDL, and CDL target data values to determine whether the memory cell is programmed. The number of latches such as ADL, BDL, and CDL is based on the number of data states in an MLC embodiment. However, as the number of sense amplifiers and associated data latches can take up relatively large among of surface area on memory die 300 or control die 311, it desirable to minimize the number of latches and in cases the transfer latch XDL can be used as an auxiliary internal data latch to augment the ADL, DBL, and CDL latches, for example, in a 4-bit per cell MLC embodiment and similarly for other MLC embodiments. In this case, the XDL, ADL, BDL, ands CDL latches can be used to store to the bits of the target state of the upper, upper-middle, lower-middle, and lower page values in a write operation. In a sensing operation for performing a verify phase of a program loop, the target data can loaded into the XDL, ADL, BDL, and CDL latches and the resultant level on the SEN or LBUS nodes is checked against the stored target data by forming various logical combinations of the latched XDL, ADL, BDL, and CDL target data values to determine whether the memory cell is programmed.

Returning to FIG. 13 and considering now transfers between the internal data latches SDL 1341 and TDL/ADL/BDL/CDL 1343 and the transfer data latches XDL 1345, the transfers can occur when write data is received at XDL 1345 and then transferred to one of SDL 1341 or TDL/ADL/BDL/CDL 1343 for use in programming, or when read data stored in one of SDL 1341 or TDL/ADL/BDL/CDL 1343 is transferred to XDL 1345 and onward to the I/O interface. Transfers are also made when data is shuffled around between SDL 1341 or TDL/ADL/BDL/CDL 1343 and XDL 1345 when XDL 1345 is used as an auxiliary internal to augment ADL/BDL/CDL 1343, as 4-state MLC embodiment discussed in the preceding paragraph, and also when data is shifted around to form logical combinations of the data stored in the latches, as when determining whether a memory cell is programmed.

To consider one example of a transfer between an internal data latch and the transfer data latch, an embodiment of a transfer from ADL 1343 to XDL 1345 can be considered, where a similar process can be used for the other data latches. In this example, the data content stored in ADL 1343 transferred to the node $SEN_2$ 1305$_2$. At this point the data content of ADL 1343 is parked on $SEN_2$ 1305$_2$ and ADL 1343 is available to receive new data. The ADL data moved to $SEN_2$ 1305$_2$ can then further be transferred to transfer latch XDL 1345 or others of the latches.

Considering the ADL 1343 to XDL 1345 transfer further, SEN2 1305$_2$ can be pre-charged by charging SEN1 1305$_1$ by VHLB through SPC 1323, and transferring the charge to SEN2 1305$_2$ through S2S 1331. (Once SEN2 1305$_2$ is pre-charged, S2S 1331 can be turned off if desired.) VLOP can be set to a low value, such a 0V. The ADL value can then be used to set LBUS 1301, so that if LBUS is high 1335 is ON and if LBUS is low 1335 is off. Once these conditions are set, LSL 1333 is turned on for an interval, so that if LBUS 1301 is high, SEN2 1305$_2$ is discharged though LSL 1333 and 1335 to VLOP; and if LBUS 1301 is low, 1335 is off and SEN2 1305$_2$ does not discharge. Consequently, SEN2 1305$_2$ is set high if LBUS 1301 is low, and SEN2 1305$_2$ is set low if LBUS 1301 is high. Referring back to FIG. 14A, either of the latched ADL value ("A", by way of 1401) or the inverse of the latched ADL value (NOT A, "~A", by way of 1403) can be placed on LBUS 1301, with the transfer respectively resulting in either ~A or A being parked on SEN2 1350$_2$. At this point the value of the data in the ADL latch is held on SEN2 1350$_2$ (as either ~A or A) and ADL 1343 is free to store new data.

Once the ADL data (either as ~A or A) is parked at SEN2 1305$_2$, it can then be transferred to XDL 1345 or other latch. The voltage on SEN2 1305$_2$, corresponding to the transferred ADL data, will set the control gate voltage on transistor 1317 determining whether it is on or off. LBUS 1301 is again pre-charged through LPC 1321 so that when STB 1315 is turned on for an interval, LBUS 1301 will discharge or not depending on whether SEN2 1305$_2$ is respectively high or not to VLOP, that can be at 0V or other low level. This will transfer the (invented) value stored on SEN2 1305$_2$ to LBUS 1301. From LBUS 1301, the voltage level can be transferred through DSW 1311 to DBUS 1303 and latched into XDL 1345. Consequently, the ADL data value transferred on to LBUS 1301 (as either A or ~A) is first transferred to SEN2 1305$_2$ (as either ~A or A, respectively) and then on to XDL 1345 (as either A or ~A, respectively).

Considering these transfers further, to accurately transfer the (inverse of the) value on SEN2 1305$_2$ to LBUS 1301, if the value is to be high, it should be high enough to effectively turn on the transistor 1317 to be able to discharge LBUS 1301 and flip a high level on SEN2 1305$_2$ to a low level on LBUS 1301. Consequently, it is important to accurately establish the value on SEN2 1305$_2$ based on the (in this example) ADL data value when transferring of this value from LBUS 1301 through LSL 1333 to SEN2 1305$_2$ is performed. Factors such as noise and parasitic capacitances can lead to a transferred high level on SEN2 1305 being reduced to the point where it can no longer be relied up to turn on the transistor 1317 and flip the data value transferred to LBUS 1301 when STB 1315 is turned on. The following considers the source of such noise, its effects on the voltage level established on SEN2 1305$_2$, and how to mitigate the problem.

As illustrated in FIGS. 14A and 14B, the latches operate between the control circuitry's high logic level VDD and low logic level of ground, so that the data values stored in the latches are either VDD or ground and that, in the ADL example given above, the ADL data value of A is either VDD or ground (with ~A respectively ground or VDD). Consequently, the high value for LBUS 1301 and on SEN2 1305$_2$ is VDD and the low value is ground. To reduce power consumption, memory devices have moved to progressively lower VDD values, such as 1.5V or less. Within the sense amplifier circuits, to pass the VDD level many of the switches (e.g., STB 1315, BLQ 1313, DSW 1311, and others) operate at elevated sense amplifier high logic level, or "VDDSA", that is, for example, ~0.5-1.0 volts higher than the VDD voltage level. To successfully turn on 1317, the voltage on SEN2 1305$_2$ needs to be above the threshold voltage of 1317 and, as VDD values move lower, the margin for VDD being affected by coupling noise and charge sharing noise also becomes lower. Consequently, after SEN2 1305$_2$ is pre-charged and the ADL data is on LBUS 1301, it is important that, when that he ADL data sets LBUS 1301 low, SEN2 1305$_2$ does not discharge significantly through the charge sharing node X 1395 when LSL 1333 is turned on for an interval and also that SEN2 1305$_2$ is not pulled down significantly by parasitics.

Figure 15:
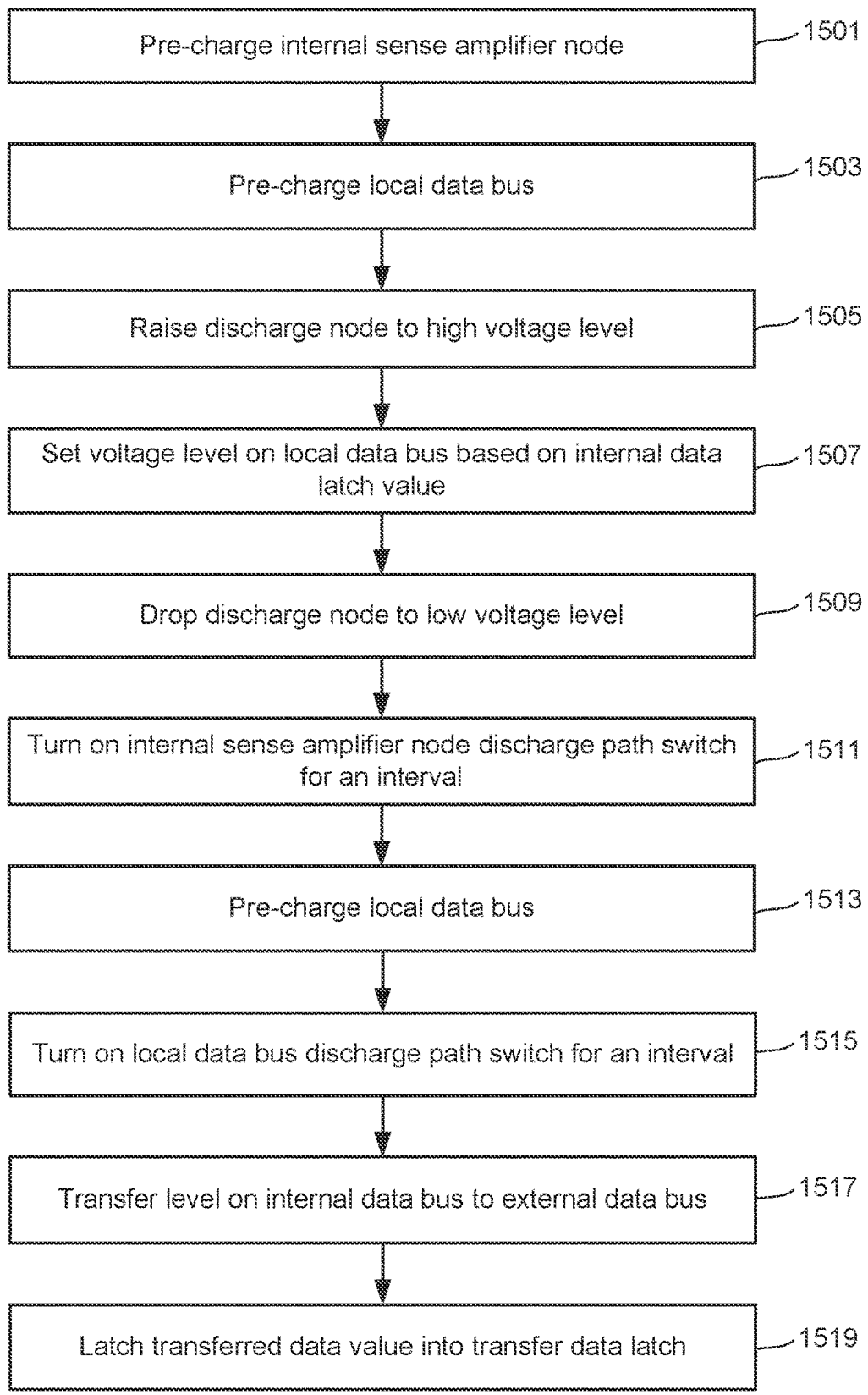
FIG. 15 is a flowchart for an embodiment for transferring data values between the data latches associated with a sense amplifier with reduced noise.

FIG. 13 illustrates some examples of the parasitics related to the SEN nodes SEN1 1305$_1$ and SEN2 1305$_2$. The circuit diagram of FIG. 13 illustrates the topology of the sense amplifier example embodiment, but not its layout on a die and the resultant parasitic capacitances that can arise based on the location of the various lines and circuit elements of a given sense amplifier and other sense amplifiers on the die. The broken lines of parasitic capacitances 1391 and 1393 give examples for SEN1 1305$_1$ and SEN2 1305$_2$, respectively, in one embodiment. For SEN1 1305$_1$, examples of parasitic capacitance 1391 can come from LBUS 1301 or DBUS 1303 of the same sense amplifier or adjacent sense amplifiers. For SEN2 1305$_2$, examples of parasitic capacitance 1393 can come from LBUS 1301, VLOP, or BLI of the same sense amplifier or adjacent sense amplifiers. FIG. 15 presents techniques to reduce charge sharing noise and coupling noise on SEN2 1305$_2$ to improve SEN2 integrity and avoid data transfer failure.

FIG. 15 is a flowchart for an embodiment for transferring data values between the data latches associated with a sense amplifier with reduced noise. More specifically, the flow of FIG. 15 presents a charge sharing noise mitigation plan that includes one or both of pre-charging the charge sharing intermediate node X 1395, increasing VLOP to VDDSA before turning on LSL 1333, and lowering the bias level for turning on LSL 1333 for the transferring the inverse of the level on LBUS 1301 to SEN2 1305$_2$. Similar to the above discussion, the transfer will again use the example of a transfer first from ADL 1343 to SEN2 1305$_2$, and then from SEN2 1305$_2$ to XDL, but, again, this could be from another of the data latches to SEN2 1305$_2$ and then to either the transfer latch XDL 1345, an internal data latch, or out to the I/O interface. Once again, the various control signals can be provided by processor 482, state machine 362, and/or other control elements of the embodiments of FIGS. 3A and 3B.

The process again begins pre-charging the internal sensing node SEN2 1305$_2$ and then biasing its discharge path to VLOP through the series connected switches LSL 1333 and 1335, where SEN2 1305$_2$ will discharge or not depending on the value set LBUS 1301 based on the data value latched on the internal data latch of (in this example) ADL 1343. The process of FIG. 15 differs from the process described earlier in that the intermediate node X 1395 between LSL 1333 and 1335 is raised before the data latch value is set on LBUS 1301 and/or a lower control voltage is used for LSL 1333 than for other switches of the sense amplifier.

Considering the ADL 1343 to XDL 1345 transfer further, at step 1501 SEN2 1305$_2$ can also be pre-charged by charging SEN1 1305$_1$ by VHLB through SPC 1323, and transferring the charge to SEN2 1305$_2$ through S2S 1331. (Once SEN2 1305$_2$ is pre-charged, S2S 1331 can be turned off if wanted.) To set the level on X 1395, step 1503 pre-charges LBUS 1301 by VLPC through LPC 1321 to, for example, VDD and step 1505 raises VLOP to VDDSA, for example, setting X 1395 to VDDSA-Vth, where Vth is the threshold voltage of 1335. Steps 1501, 1503, and 1505 can be performed in various orders and overlap depending on the embodiment. Once these conditions are set, at step 1507 a value of an internal data latch (here A) can then be used to set LBUS 1301, so that if LBUS is high 1335 is ON and if LBUS is low 1335 is off. At step 1509 VLOP can be set to a low value, such a 0V, where the timing and order of steps 1507 and 1509 can vary based on the embodiment. The ADL value can then be used to set LBUS 1301, so that if LBUS is high 1335 is ON and if LBUS is low 1335 is off. Once these conditions are set, at step 1511 LSL 1333 is turned on for an interval, so that if LBUS 1301 is high SEN2 1305$_2$ is discharged though LSL 1333 and 1335 to VLOP; and if LBUS 1301 is low, 1335 is off and SEN2 1305$_2$ does not discharge. Consequently, SEN2 1305$_2$ is set high if LBUS 1301 is low, and SEN2 1305$_2$ is set low if LBUS 1301 is high. Referring back to FIG. 14A, either of the latched ADL value (A, by way of 1401) or the inverse of the latched ADL value (NOT A, ~A, by way of 1403) can be placed on LBUS 1301, with the transfer respectively resulting in either ~A or A being parked on SEN2 1350$_2$. At this point the value of the data in the ADL latch is held on SEN2 1350$_2$ (as either ~A or A) and ADL 1343 is free to store new data.

Once the ADL data is transferred to SEN2 1305$_2$, if wanted, the (flipped) value SEN2 1305$_2$ of the ADL data can then transferred back to LBUS 1301 by pre-charging LBUS 1301 at step 1513 and then use the discharge path for LBUS 1301 through STB 1315 in series with 1317 to VLOP, but different embodiments can use a different discharge node than is used for the SEN2 discharge path. The voltage on SEN2 1305$_2$, corresponding to the transferred ADL data, will set the control gate voltage on transistor 1317 determining whether it is on or off. LBUS 1301 is again pre-charged through LPC 1321, so that when STB 1315 is turned on for an interval at step 1515, LBUS 1301 will discharge or not to VLOP depending on whether SEN2 1305$_2$ is respectively high or not, where VLOP can be at 0V or other low level. This will transfer the (invented) value stored on SEN2 1305$_2$ to LBUS 1301. From LBUS 1301, the voltage level can be transferred through DSW 1311 to DBUS 1303 at step 1517 and latched into XDL 1345 at step 1519. Consequently, the ADL data value transferred on to LBUS 1301 (as either A or ~A) is first transferred to SEN2 1305$_2$ (as either ~A or A, respectively) and then on to XDL 1345 (as either A or ~A, respectively).

One embodiment includes a non-volatile memory device comprising a control circuit configured to connect to a plurality of bit lines each connected to one or more non-volatile memory cells. The control circuit includes a sensing circuit comprising: a first sensing node configured to connect to one or more of the bit lines; a local data bus; one or more internal data latches connected to the local data bus; and a first discharge path connected between the first sensing node and a first discharge node and comprising an intermediate node; a first discharge switch connected between the first sensing node and the intermediate node; and a first sensing node discharge transistor connected between the intermediate node and the first discharge node and having a control gate connected to the local data bus. To transfer a first data value from a first of the internal data latches to the first sensing node, the control circuit is configured to: pre-charge the first sensing node; bias the first discharge node to a high voltage level for the sensing circuit; pre-charge the local data bus to charge the intermediate node through the first sensing node discharge transistor from the first discharge node while the first discharge node is biased to the high voltage level for the sensing circuit; subsequent to charging the intermediate node, bias the first discharge node to a low voltage level; subsequent to charging the intermediate node, set a voltage level on local data bus according to the first data value; and subsequent to pre-charging the first sensing node, biasing the first discharge node to a low voltage level and charging the intermediate node, turn on the first discharge switch for a first discharge interval.

One embodiment includes a method comprising: pre-charging a sensing node of a sense amplifier circuit; charging an intermediate node of a first discharge path for the sense amplifier circuit connected between the sensing node and a first discharge node, the first discharge path including the intermediate node, a first discharge switch connected between the sensing node and the intermediate node, and a first sensing node discharge transistor connected between the intermediate node and the first discharge node and having a control gate connected to a local data bus, charging of the intermediate node comprising: biasing the first discharge node to a high voltage level for sense amplifier circuit; and pre-charging the local data bus, where the local data bus is pre-charged concurrently with the first discharge node biased to the high voltage level for the sense amplifier circuit; subsequent to charging the intermediate node, biasing the first discharge node to a low voltage level; subsequent to charging the intermediate node, setting a voltage level on local data bus according to a first data value from an internal data latch connected to the local data bus; and subsequent to pre-charging the sensing node, biasing the first discharge node to a low voltage level and charging the intermediate node, turning on the first discharge switch for a first discharge interval to transfer the first data value from the internal data latch to the sensing node.

One embodiment includes a sense amplifier circuit having: a sensing node respectively configured to connect to bit lines of an array of non-volatile memory cells; a local data bus; one or more internal data latches connected between the sensing node and a first discharge node, comprising: an intermediate node; a first discharge switch connected between the first sensing node and the intermediate node; and a first sensing node discharge transistor connected between the intermediate node and the first discharge node and having a control gate connected to the local data bus; and one or more control circuits connected to the internal data latches and the first discharge path. The one or more control circuits are configured to transfer a first data value from a first of the internal data latches to the sensing node by: pre-charging the first sensing node; biasing the first discharge node to a high voltage level for the sense amplifier circuit; pre-charging the local data bus to charge the intermediate node through the first sensing node discharge transistor from the first discharge node while the first discharge node is biased to the high voltage level for the sensing circuit; subsequent to charging the intermediate node, biasing the first discharge node to a low voltage level; subsequent to charging the intermediate node, setting a voltage level on local data bus according to the first data value; and subsequent to pre-charging the first sensing node, biasing the first discharge node to a low voltage level and charging the intermediate node, turning on the first discharge switch for a first discharge interval.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
a control circuit configured to connect to a plurality of bit lines each connected to one or more non-volatile memory cells, the control circuit comprising:
a sensing circuit comprising:
a first sensing node configured to connect to one or more of the bit lines;
a local data bus;

one or more internal data latches connected to the local data bus; and
a first discharge path connected between the first sensing node and a first discharge node and comprising:
an intermediate node;
a first discharge switch connected between the first sensing node and the intermediate node; and
a first sensing node discharge transistor connected between the intermediate node and the first discharge node and having a control gate connected to the local data bus,
where, to transfer a first data value from a first of the internal data latches to the first sensing node, the control circuit is configured to:
pre-charge the first sensing node;
bias the first discharge node to a high voltage level for the sensing circuit;
pre-charge the local data bus to thereby charge the intermediate node from the first discharge node through the first sensing node discharge transistor while the first discharge node is biased to the high voltage level for the sensing circuit;
subsequent to charging the intermediate node, bias the first discharge node to a low voltage level;
subsequent to charging the intermediate node, set a voltage level on local data bus according to the first data value; and
subsequent to pre-charging the first sensing node, biasing the first discharge node to a low voltage level and charging the intermediate node, turn on the first discharge switch for a first discharge interval.

2. The non-volatile memory device of claim 1, wherein the control circuit is formed on a control die, the non-volatile memory device further comprising:
a memory die including the non-volatile memory cells, the memory die separate from and bonded to the control die.

3. The non-volatile memory device of claim 1, wherein the sensing circuit comprises a plurality of switches in addition to the first discharge switch, and the control circuit is further configured to turn on the plurality of switches other than the first discharge switch using a first high logic level, and further configured to turn on the first discharge switch for a for first discharge interval using a second high logic level, the second high logic level being lower than the first high logic level.

4. The non-volatile memory device of claim 3, wherein to bias the first discharge node to the high voltage level for the sensing circuit, the first discharge node is biased to the second high logic level.

5. The non-volatile memory device of claim 1, the sensing circuit further comprising:
a second discharge path connected between the local data bus and a second discharge node and comprising:
a second discharge switch; and
a first sensing node discharge transistor connected in series with the second discharge switch between the local data bus and the second discharge node and having a control gate connected to the first sensing node,
wherein, subsequent to transferring the first data value from the first of the internal data latches to the first sensing node, to transfer the first data value from the first sensing node to the local data bus, the control circuit is further configured to:
pre-charge the local data; and
subsequent to pre-charging the local data bus, turn on the second discharge switch for a second discharge interval.

6. The non-volatile memory device of claim 5, wherein, subsequent to transferring the first data value from the first sensing node to the local data bus, the control circuit is further configured to latch the transferred first data value on the local data bus in one of the internal data latches.

7. The non-volatile memory device of claim 5, the sensing circuit further comprising:
an external data bus connectable to the local data bus, wherein, subsequent to transferring the first data value from the first sensing node to the local data bus, the control circuit is further configured to further transfer the first data value from the local data bus to the external data bus.

8. The non-volatile memory device of claim 7, the sensing circuit further comprising:
a transfer data latch connected to the external data bus, wherein, subsequent to further transferring the first data value from the local data bus to the external data bus, the control circuit is further configured to latch the transferred first data value on the external data bus in the transfer data latch.

9. The non-volatile memory device of claim 5, wherein the second discharge node is the same as the first discharge node.

10. The non-volatile memory device of claim 1, wherein in transferring the first data value from a first of the internal data latches to the first sensing node, an inverse of the first data value is transferred to the first sensing node.

11. The non-volatile memory device of claim 1, wherein, subsequent to transferring the first data value from the first of the internal data latches to the first sensing node, the control circuit is further configured to latch a new data value in the first internal data latch.

12. The non-volatile memory device of claim 1, further comprising the bit lines and the non-volatile memory cells, wherein the control circuit further configured to:
pre-charge the first sensing node for a first sensing operation of a selected memory cell along a first bit line;
discharge the pre-charged first sense node through the selected memory cell by an amount dependent on a programmed state of the selected memory cell; and
based on the amount the first sense node discharged, latch a sensed data value in the internal data latches.

13. The non-volatile memory device of claim 1, wherein the sensing circuit further comprises a second sensing node and to pre-charge the first sensing node, the control circuit is further configured to:
pre-charge the second sensing node; and
pre-charge the first sensing node from the second sensing node.

14. A method, comprising:
pre-charging a sensing node of a sense amplifier circuit;
charging an intermediate node of a first discharge path for the sense amplifier circuit connected between the sensing node and a first discharge node, the first discharge path including the intermediate node, a first discharge switch connected between the sensing node and the intermediate node, and a first sensing node discharge transistor connected between the intermediate node and the first discharge node and having a control gate connected to a local data bus, charging of the intermediate node comprising:
biasing the first discharge node to a high voltage level for sense amplifier circuit; and pre-charging the local data bus, where the local data bus is pre-charged concurrently with the first discharge node biased to the high voltage level for the sense amplifier circuit;

subsequent to charging the intermediate node, biasing the first discharge node to a low voltage level;

subsequent to charging the intermediate node, setting a voltage level on local data bus according to a first data value from an internal data latch connected to the local data bus; and subsequent to pre-charging the sensing node, biasing the first discharge node to a low voltage level and charging the intermediate node, turning on the first discharge switch for a first discharge interval to transfer the first data value from the internal data latch to the sensing node.

15. The method of claim 14, wherein the sense amplifier circuit comprises a plurality of switches in addition to the first discharge switch that the sense amplifier is configured to turn on using a first high logic level, and wherein turning on the first discharge switch for the first discharge interval comprises turning on the first discharge switch using a second high logic level, the second high logic level being lower than the first high logic level.

16. The method of claim 14, further comprising:
subsequent to transferring the first data value from the internal data latch to the sensing node, transferring the first data value from the sensing node to the local data bus by:
pre-charging the local data; and
subsequent to pre-charging the local data bus, turning on a second discharge switch for a second discharge interval, the second discharge switch connected between the local data bus and a second discharge node in series with a first sensing node discharge transistor having a control gate connected to the sensing node.

17. The method of claim 16, further comprising:
subsequent to transferring the first data value from the sensing node to the local data bus, transferring the first data value from the local data bus to an external data bus; and
latch the transferred first data value on the external data bus in a transfer data latch connected to the external data bus.

18. A sense amplifier circuit, comprising:
a sensing node respectively configured to connect to bit lines of an array of non-volatile memory cells;
a local data bus;
one or more internal data latches connected to the local data bus;
a first discharge path connected between the sensing node and a first discharge node, comprising:
an intermediate node;
a first discharge switch connected between the first sensing node and the intermediate node; and
a first sensing node discharge transistor connected between the intermediate node and the first discharge node and having a control gate connected to the local data bus; and
one or more control circuits connected to the internal data latches and the first discharge path, the one or more control circuits configured to:
transfer a first data value from a first of the internal data latches to the sensing node by:
pre-charging the first sensing node;
biasing the first discharge node to a high voltage level for the sense amplifier circuit;
pre-charging the local data bus to charge the intermediate node through the first sensing node discharge transistor from the first discharge node while the first discharge node is biased to the high voltage level for the sensing circuit;
subsequent to charging the intermediate node, biasing the first discharge node to a low voltage level;
subsequent to charging the intermediate node, setting a voltage level on local data bus according to the first data value; and
subsequent to pre-charging the first sensing node, biasing the first discharge node to a low voltage level and charging the intermediate node, turning on the first discharge switch for a first discharge interval.

19. The sense amplifier circuit of claim 18, further comprising:
a plurality of switches in addition to the first discharge switch, wherein the one or more control circuits are further configured to:
turn on the plurality of switches other than the first discharge switch using a first high logic level; and
turn on the first discharge switch for a for first discharge interval using a second high logic level, the second high logic level being lower than the first high logic level.

20. The sense amplifier circuit of claim 18, further comprising:
a second discharge path connected between the local data bus and a second discharge node and comprising:
a second discharge switch; and
a first sensing node discharge transistor connected in series with the second discharge switch between the local data bus and the second discharge node and having a control gate connected to the sensing node,
wherein, subsequent to transferring the first data value from the first of the internal data latches to the sensing node, the one or more control circuits are further configured to:
transfer the first data value from the sensing node to the local data by:
pre-charging the local data; and
subsequent to pre-charging the local data bus, turning on the second discharge switch for a second discharge interval.

* * * * *